United States Patent
Sera et al.

(10) Patent No.: US 7,344,931 B2
(45) Date of Patent: Mar. 18, 2008

(54) SEMICONDUCTOR DEVICE, METHOD OF MANUFACTURING THE SAME, AND ELECTRO-OPTICAL DEVICE

(75) Inventors: Hiroshi Sera, Chino (JP); Tsukasa Eguchi, Showa-machi (JP)

(73) Assignee: Seiko Epson Corporation, Tokyo (JP)

( * ) Notice: Subject to any disclaimer, the term of this patent is extended or adjusted under 35 U.S.C. 154(b) by 372 days.

(21) Appl. No.: 11/168,857

(22) Filed: Jun. 29, 2005

(65) Prior Publication Data

US 2006/0008955 A1    Jan. 12, 2006

(30) Foreign Application Priority Data

Jul. 12, 2004   (JP)   ............................. 2004-204574
Apr. 14, 2005   (JP)   ............................. 2005-117115

(51) Int. Cl.
*H01L 21/00* (2006.01)
*H01L 29/76* (2006.01)

(52) U.S. Cl. ...................... 438/163; 438/151; 438/301; 257/336

(58) Field of Classification Search ................ 438/149, 438/151, 154, 163, 299, 301, 306; 257/335, 257/336, 337, 344, 347
See application file for complete search history.

(56) References Cited

U.S. PATENT DOCUMENTS

| | | | | |
|---|---|---|---|---|
| 6,049,092 A | * | 4/2000 | Konuma et al. | ............... 257/66 |
| 6,133,074 A | * | 10/2000 | Ishida et al. | ................ 438/153 |
| 6,617,644 B1 | * | 9/2003 | Yamazaki et al. | .......... 257/347 |
| 6,867,431 B2 | * | 3/2005 | Konuma et al. | ............... 257/66 |
| 7,172,928 B2 | * | 2/2007 | Yamazaki | ................... 438/149 |
| 2002/0025591 A1 | | 2/2002 | Ohnuma et al. | |
| 2002/0134983 A1 | * | 9/2002 | Yamazaki | ..................... 257/72 |

FOREIGN PATENT DOCUMENTS

JP    2002-151523 A    5/2002

* cited by examiner

*Primary Examiner*—Kevin M. Picardat
(74) *Attorney, Agent, or Firm*—Oliff & Berridge, PLC

(57) ABSTRACT

The present invention is directed to a method of manufacturing a semiconductor device including a semiconductor layer having a heavily doped source region, a heavily doped drain region, a lightly doped source region, a lightly doped drain region and a channel region, and a gate electrode opposite to the semiconductor layer with an insulating layer interposed therebetween. The method includes forming a semiconductor film on a substrate, forming a resist on the semiconductor film such that a first portion of the resist corresponding to the heavily doped source region and the heavily doped drain region is thinner than a second portion of the resist corresponding to the lightly doped source region, the lightly doped drain region and the channel region. In addition, the method includes forming the heavily doped source region and the heavily doped drain region by etching the semiconductor film in a predetermined pattern using the resist as a mask and injecting high density impurities into the semiconductor film through the first portion of the resist, removing the resist from the semiconductor film to form a gate insulating layer on the semiconductor film. Further, the method includes forming the gate electrode at a position on the gate insulating layer which corresponds to the channel region, and forming the lightly doped source region and the lightly doped drain region by injecting impurities having a density lower than the density of the high density impurities into the semiconductor film using the gate electrode as a mask.

21 Claims, 15 Drawing Sheets

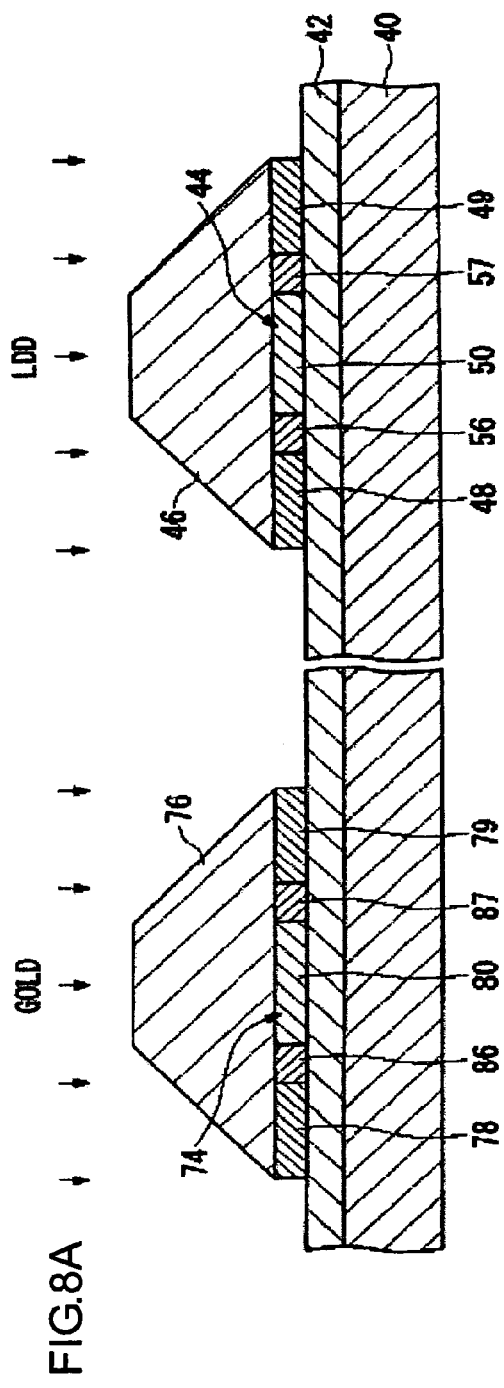
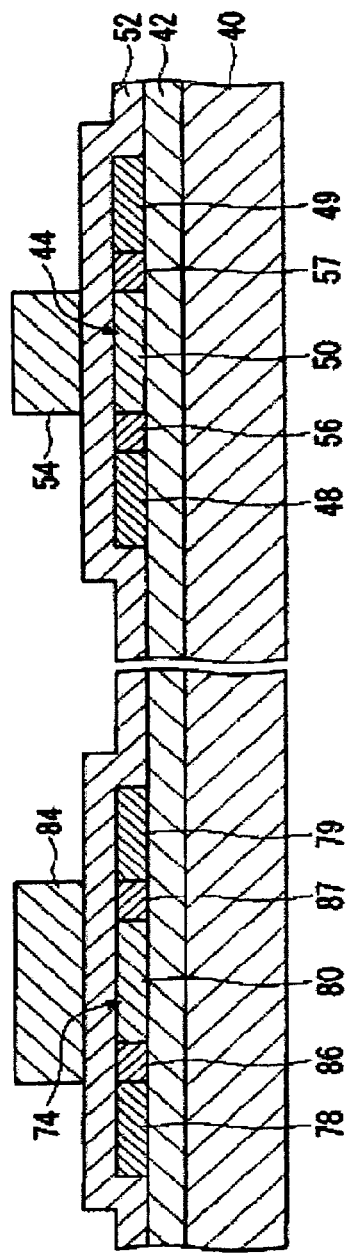
FIG.8A
FIG.8B

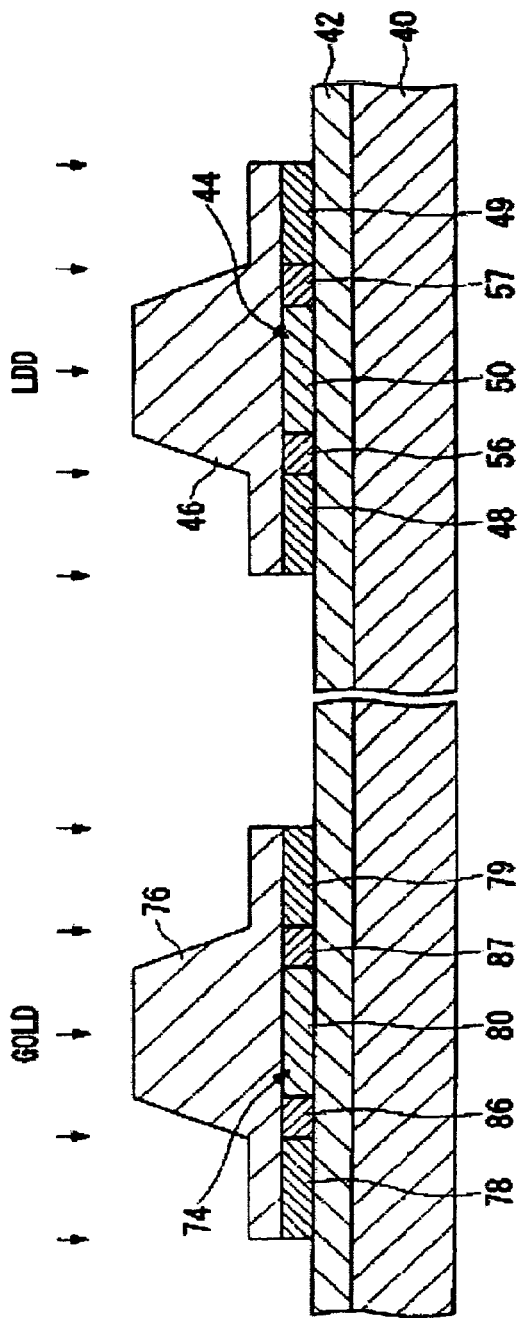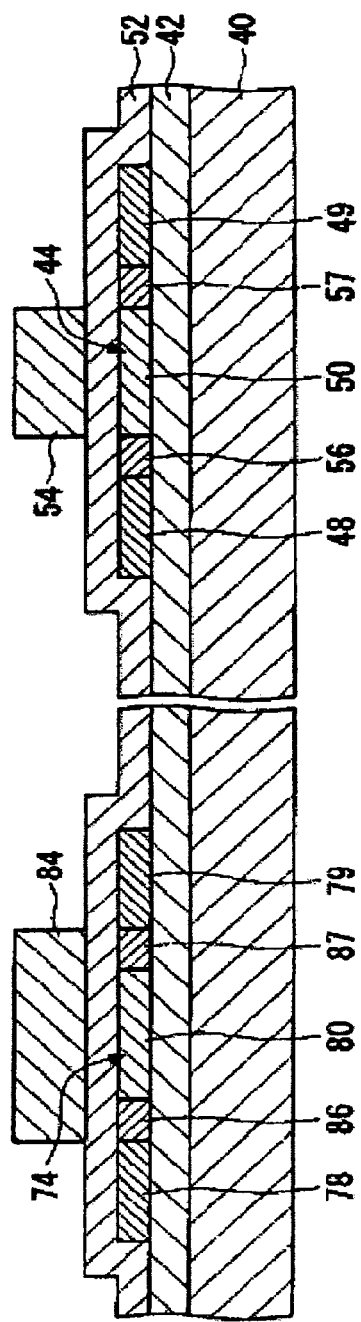
FIG.9A
FIG.9B

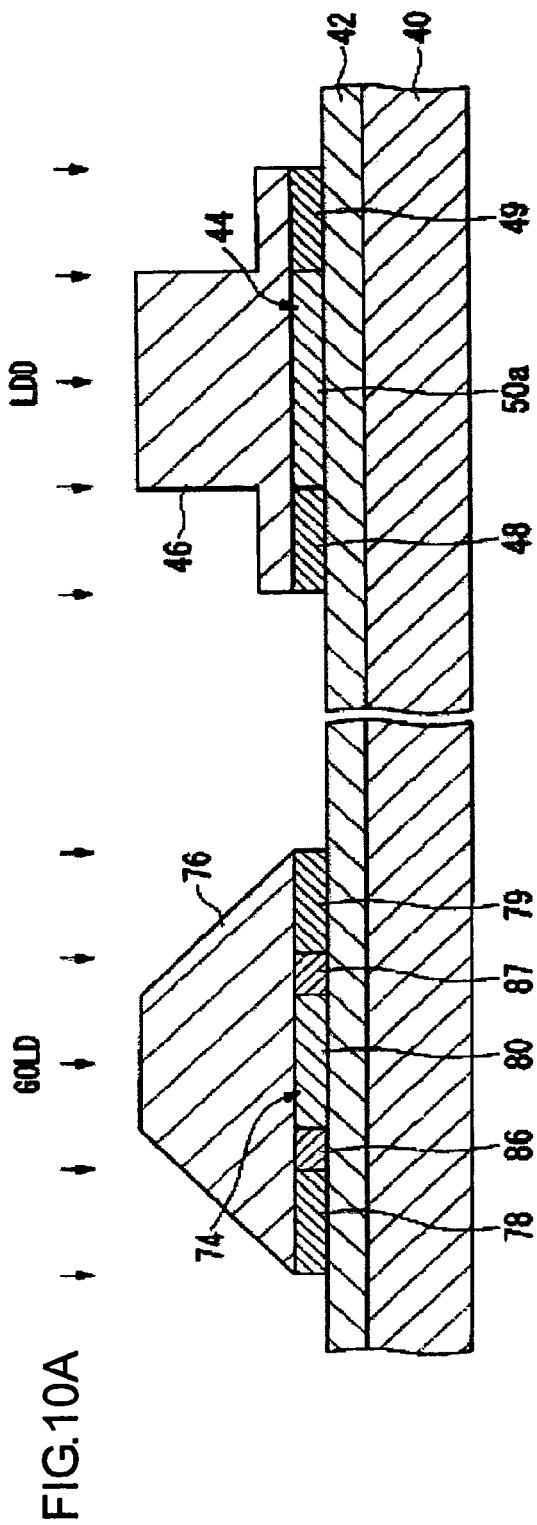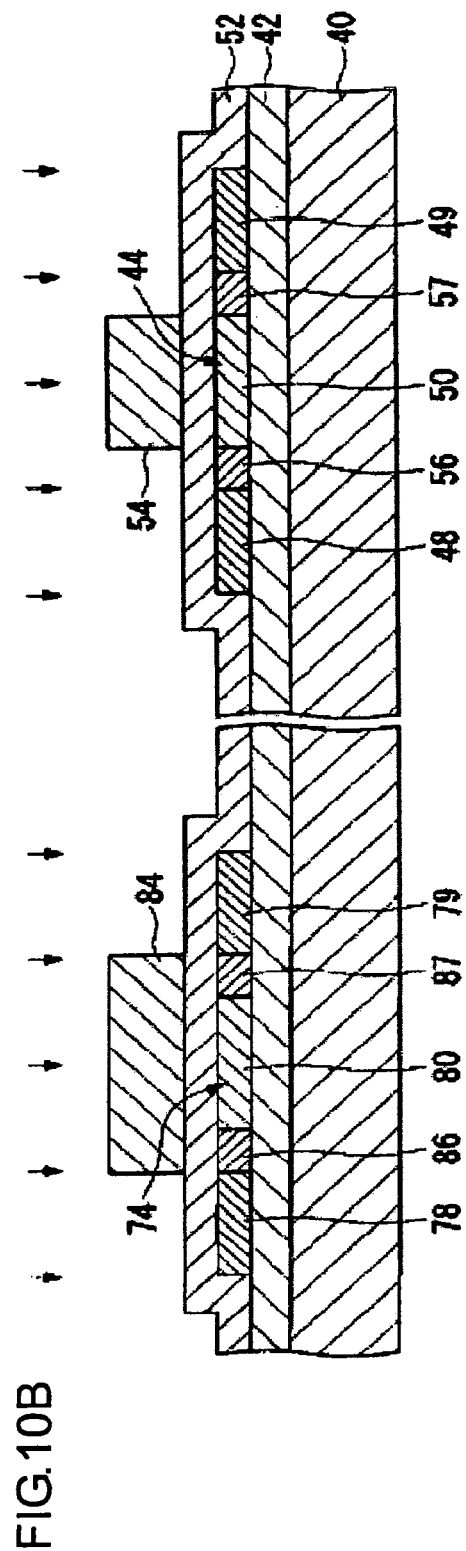
FIG.10A
FIG.10B

SEMICONDUCTOR DEVICE, METHOD OF MANUFACTURING THE SAME, AND ELECTRO-OPTICAL DEVICE

BACKGROUND

The present invention relates to a semiconductor device, to a method of manufacturing the same, and to an electro-optical device.

As an electro-optical device, such as a liquid crystal display device, an organic electroluminescent (EL) device, a plasma display device, and the like, an active-matrix-type electro-optical device in which thin film transistors (TFTs) serving as thin film semiconductor devices are provided in a plurality of pixels arranged in a matrix in order to drive the plurality of pixels has been widely used. In the TFT, it is common to form amorphous silicon or polycrystalline silicon as a channel region. Particularly, since electrons or holes in a polycrystalline silicon TFT manufactured by only a low-temperature process have high mobility due to a high electric field, the polycrystalline silicon TFT has been employed for electro-optical devices, such as liquid crystal display devices, organic EL devices, and the like.

As the TFT, a TFT having a lightly doped drain (LDD) structure and a TFT having a gate-drain overlapped LDD (GOLD) structure have been well known. The TFT having the LDD structure has a structure in which a lightly doped impurity region is formed in a polycrystalline silicon layer corresponding to an outer region outside a region immediately under a gate electrode and a heavily doped impurity region, which become a source region and a drain region, is formed in the outer region, thereby suppressing an off current value. On the other hand, the TFT having the GOLD structure has a structure in which the lightly doped impurity region having the LDD structure is formed up to a region immediately under an end portion of a gate electrode in such a manner that the lightly doped impurity region overlaps the end portion, thereby suppressing a hot carrier phenomenon.

As one example of methods of forming the TFT having the LDD and GOLD structures, disclosed is a method in which the LDD structure is formed by forming a resist pattern having a region whose edge portion has a film thickness smaller than that of its center portion using a photomask or the like having a diffraction grating pattern, etching a conductive film in such a manner that a gate electrode having a region whose edge portion has a film thickness smaller than that of its center portion is formed, and implanting impurities into a semiconductor layer using a mask electrode as a mask (for example, see Japanese Unexamined Patent Application Publication No. 2002-151523 which is an example of the related art).

In the method of forming the TFT having the LDD and GOLD structures disclosed in the related art, both end portions of the gate electrode are dry etched using the resist pattern as a mask pattern such that the residual film thickness becomes 5% to 30% of the initial film thickness, and then, a lightly doped impurity region is formed in the semiconductor layer using the gate electrode as the mask.

However, in the method of forming the TFT having the LDD and GOLD structures, the selectivity ratio of dry etching should be considered in order to control the film thickness of the gate electrode to be a desired thickness. This may cause complexity of machining of the gate electrode. In addition, when the selectivity ratio is considered in order to control the film thickness of the gate electrode in dry etching as mentioned above, a problem occurs in that the selection of the material of the gate electrode, the etchant and the like to obtain a desired selectivity ratio is limited.

SUMMARY

An advantage of the invention is that it provides a method of simplifying the process of manufacturing a semiconductor device having an LDD or GOLD structure.

According to a first aspect, in a method of manufacturing a semiconductor device having a semiconductor layer having a heavily doped source region, a heavily doped drain region, a lightly doped source region, a lightly doped drain region and a channel region, and a gate electrode opposite to the semiconductor layer with an insulating layer interposed therebetween, the method includes forming a semiconductor film on a substrate; forming a resist on the semiconductor film such that a first portion of the resist corresponding to the heavily doped source region and the heavily doped drain region is thinner than a second portion of the resist corresponding to the lightly doped source region, the lightly doped drain region and the channel region; forming the heavily doped source region and the heavily doped drain region by etching the semiconductor film in a predetermined pattern using the resist as a mask and injecting high density impurities into the semiconductor film through the first portion of the resist; removing the resist from the semiconductor film to form a gate insulating layer on the semiconductor film; forming the gate electrode at a position on the gate insulating layer which corresponds to the channel region; and forming the lightly doped source region and the lightly doped drain region by injecting impurities having a density lower than the density of the high density impurities into the semiconductor film using the gate electrode as a mask.

The semiconductor device manufactured by the manufacturing method is a semiconductor device having a so-called LDD structure and has a small off current value.

In general, a semiconductor devices having a conventional LDD structure is formed by performing a photolithography process three times. For example, the photolithography process is once performed to form a mask used to etch a semiconductor layer in a predetermined shape, and, in addition, this photolithography process is twice performed to form a mask used to pattern a gate electrode in a predetermined shape.

To the contrary, according to this aspect, after a resist is directly formed on the semiconductor layer, a region of the resist corresponding to heavily doped source and drain regions is thinly formed in a predetermined shape by a photolithography method. Therefore, while the semiconductor layer is etched in the predetermined shape using the resist as a mask, impurities with specific density can be injected into the semiconductor layer using the resist as the mask once more. That is, the resist of the predetermined shape formed by a single photolithography process can be used for both processes of etching of the semiconductor layer and injection of the impurities. For this reason, the semiconductor device having the LDD structure can be formed by two photolithography processes including a process of patterning the gate electrode in the predetermined shape. Accordingly, the photolithography process can be reduced by one time as compared to the conventional method. In addition, processes accompanying the photolithography process, for example, a process of removing the resist, may also be saved.

In addition, the impurities are directly injected into the semiconductor layer using the photoresist as the mask without interposing the gate insulating layer formed on the semiconductor layer. Accordingly, the gate insulating layer can be prevented from being damaged due to the injection of the impurities, which results in the gate insulating layer having high reliability and good insulating properties.

In addition, since the heavily doped source and drain regions are formed using the resist as the mask and the lightly doped source and drain regions are formed using the gate electrode as the mask, all impurity regions can be formed in a self-alignment manner.

In addition, before the semiconductor layer is patterned in a predetermined shape, a position of the heavily doped source and drain regions to be formed on the semiconductor layer can be set. Accordingly, when the impurities are injected into the semiconductor layer to form the heavily doped source and drain regions, these regions can be formed on the semiconductor layer without requiring an alignment of the mask with the semiconductor layer.

Preferably, during the forming of the resist in the method of manufacturing the semiconductor device, the first portion of the resist corresponding to the heavily doped source region and the heavily doped drain region is formed to be thinner than the second portion of the resist corresponding to the lightly doped source region, the lightly doped drain region and the channel region by using a photomask having locally different transmittance when the resist is exposed.

With this configuration, in the photolithography process, the resist can be exposed and developed by controlling intensity of exposure light penetrating the mask or reticle. That is, it is possible to employ halftone exposure. As a result, the resist can be controlled to have a desired film thickness. Therefore, by changing the film thickness of the resist, heavily doped, lightly doped, or non-impurity regions can be selectively formed on the semiconductor layer.

Preferably, in the forming of the resist in the method of manufacturing the semiconductor device, the first portion of the resist corresponding to the heavily doped source region and the heavily doped drain region is formed to have a film thickness of 50 nm to 200 nm.

With this configuration, impurities with high density injected into the semiconductor layer by an ion injector can pass through the resist while maintaining the high density. Therefore, the source and drain regions containing the high density impurities can be formed on the semiconductor layer.

Preferably, the forming of the heavily doped source and drain regions in the method of manufacturing the semiconductor device includes etching the semiconductor film in a predetermined pattern using the resist as a mask; and exposing a portion of the semiconductor film corresponding to the heavily doped source region and the heavily doped drain region and injecting the high density impurities into the semiconductor film to form the heavily doped source region and the heavily doped drain region.

When the resist is formed on the semiconductor layer, it is not easy to form the resist on the semiconductor layer uniformly. As a result, the impurities may not be uniformly injected into the semiconductor layer due to irregularity of a surface of the resist. On the contrary, according to this aspect, since a region of the semiconductor layer into which the impurities with high density are injected is exposed, the impurities can be directly injected into the exposed flat region of the semiconductor layer. Therefore, the impurities can be uniformly injected into the semiconductor layer.

In addition, according to a second aspect of the invention, there is provided a semiconductor device manufactured by the method of manufacturing a semiconductor device. In the semiconductor device, the heavily doped source region and the heavily doped drain region are formed to have the same width from an end portion of the semiconductor film, and the heavily doped source region and the heavily doped drain region of the semiconductor film are thinner than the lightly doped source region, the lightly doped drain region and the channel region.

With this configuration, since the heavily doped source and drain regions have the same width from the end portion of the semiconductor layer, the semiconductor device having specific electrical characteristics can be obtained.

Here, the reason why the heavily doped source and drain regions have the same width from the end portion of the semiconductor layer is that a region of the resist corresponding to the semiconductor layer into which the impurities are injected is formed in advance by performing the halftone exposure by the photolithography process for the resist after the resist is formed on the semiconductor layer. That is, a thin region of the resist becomes the heavily doped source and drain regions in the semiconductor layer. Then, using the resist as the mask, the semiconductor layer is etched in a predetermined shape, and thereafter, the impurities are injected into the semiconductor layer. Accordingly, the heavily doped source and drain regions can be formed in a self-alignment manner irrespective of the width of the semiconductor layer, that is, without requiring any alignment, before the semiconductor layer is etched in the predetermined shape. In addition, in the forming of the resist, by forming the thin region of the resist with the same width from the end portion of the resist, the thin region of the resist can be controlled to have the same width from an end of the semiconductor layer of the heavily doped source and drain regions formed on the semiconductor layer.

In addition, the reason why the film thickness of the semiconductor layer of the heavily doped source and drain regions is that, when impurities with high density are injected into the semiconductor layer, generally, the high density impurity region has an etching rate higher than that of a non-impurity region. In addition, when the gate insulating layer is formed on the semiconductor layer, it is common to perform a hydrofluoric acid (strong acid) treatment in advance for the semiconductor layer. Therefore, since the semiconductor layer into which the high-density impurities are injected has a high etching rate of the hydrofluoric acid as compared to the non-impurity region, the semiconductor layer on the heavily doped source and drain regions has a film thickness smaller than that of other regions. The heavily doped source and drain regions in which the semiconductor layer has the small film thickness are formed with the same width from the both ends of the semiconductor layer.

According to a third aspect of the invention, there is provided a method of manufacturing a semiconductor device including a semiconductor layer having a heavily doped source region, a heavily doped drain region, a lightly doped source region, a lightly doped drain region and a channel region, and a gate electrode opposite to the semiconductor layer with an insulating layer interposed therebetween, the method including forming a semiconductor film on a substrate; forming a resist on the semiconductor film such that a first portion of the resist corresponding to the heavily doped source region and the heavily doped drain region is thinner than a second portion of the resist corresponding to the lightly doped source region, the lightly doped drain region and the channel region; forming the heavily doped source region and the heavily doped drain region by injecting high density impurities into the semiconductor film through the first portion of the resist; etching the semiconductor film in a predetermined pattern using the resist as a mask; removing the resist from the semiconductor film to form a gate insulating layer on the semiconductor film; forming the gate electrode at a position on the gate insulating layer which corresponds to the channel region; and forming the lightly doped source region and the lightly doped drain region by injecting impurities having a density lower than the density of the high density impurities into the semiconductor film using the gate electrode as a mask. In the etching of the semiconductor film, of an impurity region of the semiconductor film below the second portion of the resist, the high density impurities being injected into the impurity region, the semiconductor film in an impurity region extending in parallel to a channel length of the channel region is removed.

According to this aspect, the impurity region extending in parallel to the channel length of at least the channel region can be removed by the etching process. Accordingly, as the impurity region, which is a pass of electric charges, is removed, it can be prevented electric charges from being leaked from the source region to the drain region. Therefore, correct switching of the semiconductor device is possible by switching on/off of the gate electrode.

According to a fourth aspect of the invention, there is provided a semiconductor device manufactured by the above method of manufacturing a semiconductor device. In this semiconductor device, the heavily doped source region and the heavily doped drain region are narrower than the lightly doped source region and the lightly doped drain region, respectively.

With this configuration, the impurity region immediately below the thick region of the resist can be reliably removed. Therefore, as the impurity region, which is a pass of electric charges, is removed, it can be prevented electric charges from being leaked from the source region to the drain region. Accordingly, correct switching of the semiconductor device is possible by switching on/off of the gate electrode.

According to a fifth aspect of the invention, there is provided a method of manufacturing a semiconductor device including a semiconductor layer having a heavily doped source region, a heavily doped drain region, a lightly doped source region, a lightly doped drain region and a channel region, and a gate electrode opposite to the semiconductor layer with an insulating layer interposed therebetween, the method including forming a semiconductor film on a substrate; forming a resist on the semiconductor film such that a first portion of the resist corresponding to the heavily doped source region, the heavily doped drain region, the lightly doped source region and the lightly doped drain region is thinner than a second portion of the resist corresponding to the channel region; forming the lightly doped source region and the lightly doped drain region by etching the semiconductor film in a predetermined pattern using the resist as a mask and injecting low density impurities into the semiconductor film through the first portion of the resist; removing the resist from the semiconductor film to form a gate insulating layer on the semiconductor film; forming the gate electrode at a position on the gate insulating layer which corresponds to the lightly doped source region, the lightly doped drain region and the channel region; and forming the heavily doped source region and the heavily doped drain region by injecting impurities having a density higher than the density of the low density impurities into the semiconductor film using the gate electrode as a mask.

The semiconductor device manufactured by the manufacturing method is a semiconductor device having a so-called GOLD structure and has a characteristic of good measures for hot carriers.

With this configuration, after a resist is directly formed on the semiconductor layer, a region of the resist corresponding to the heavily doped source and drain regions or the lightly doped source and drain regions is thinly formed in a predetermined shape by a photolithography method. Therefore, while the semiconductor layer is etched in the predetermined shape using the resist as a mask, impurities with specific density can be injected into the semiconductor layer using the resist as the mask once more. That is, the resist of the predetermined shape formed by a single photolithography process can be used for both processes of etch of the semiconductor layer and injection of the impurities. Therefore, the semiconductor device having the GOLD structure can be formed by two photolithography processes including a process of patterning the gate electrode in the predetermined shape. Accordingly, the photolithography process can be reduced by one time as compared to the conventional method. In addition, processes accompanying the photolithography process, for example, a process of removing the resist may also be saved.

Preferably, during the forming of the resist in the method of manufacturing the semiconductor device, the first portion of the resist corresponding to the lightly doped source region and the lightly doped drain region is thinner than the second portion of the resist corresponding to the channel region by using a photomask having locally different transmittance when the resist is exposed.

With this configuration, in the photolithography process, the resist can be exposed and developed by controlling intensity of exposure light penetrating the mask or reticle. That is, it is possible to employ halftone exposure. Therefore, the resist can be controlled to have a desired film thickness. Accordingly, by changing the film thickness of the resist, heavily doped, lightly doped, or non-impurity regions can be selectively formed on the semiconductor layer.

Preferably, in the forming of the resist in the method of manufacturing the semiconductor device, the first portion of the resist corresponding to the lightly doped source region and the lightly doped drain region is formed to have a film thickness of 50 nm to 200 nm.

With this configuration, impurities with high density injected into the semiconductor layer by an ion injector can pass through the resist while maintaining the low density. Therefore, the source and drain regions containing the high density impurities can be formed on the semiconductor layer.

Preferably, the forming of the lightly doped source region and the lightly doped drain region in the manufacturing method of the semiconductor device includes etching the semiconductor film in a predetermined pattern using the resist as a mask; and exposing a portion of the semiconductor film corresponding to the heavily doped source region, the heavily doped drain region, the lightly doped source region and the lightly doped drain region and injecting the low density impurities into the semiconductor film to form the lightly doped source region and the lightly doped drain region.

When the resist is formed on the semiconductor layer, it is not easy to form the resist on the semiconductor layer uniformly. Therefore, the impurities may not be uniformly injected into the semiconductor layer due to irregularity of a surface of the resist. On the contrary, according to this aspect, since a region of the semiconductor layer into which the impurities with low density are injected is exposed, the impurities can be directly injected into the exposed flat region of the semiconductor layer. Therefore, the impurities can be uniformly injected into the semiconductor layer.

According to a sixth aspect of the invention, there is provided a method of manufacturing a semiconductor device including a semiconductor layer having a heavily doped source region, a heavily doped drain region, a lightly doped source region, a lightly doped drain region and a channel region, and a gate electrode opposite to the semiconductor layer with an insulating layer interposed therebetween, the method including forming a semiconductor film on a substrate; forming a resist on the semiconductor film such that a first portion of the resist corresponding to the heavily doped source region, the heavily doped drain region, the lightly doped source region and the lightly doped drain region is thinner than a second portion of the resist corresponding to the channel region; forming the lightly doped source region and the lightly doped drain region by injecting low density impurities into the semiconductor film through the first portion of the resist; etching the semiconductor film in a predetermined pattern using the resist as a mask; removing the resist from the semiconductor film to form a gate insulating layer on the semiconductor film; forming the gate electrode at a position on the gate insulating layer which corresponds to the lightly doped source region, the lightly doped drain region and the channel region; and forming the heavily doped source region and the heavily doped drain region by injecting impurities having a density higher than the density of the low density impurities into the semiconductor film using the gate electrode as a mask. In etching the semiconductor film, of an impurity region of the semiconductor film below the second portion of the resist, the low-density impurities being injected into the impurity region, the semiconductor film in an impurity region extending in parallel to a channel length of the channel region is removed.

According to this aspect, the impurity region extending in parallel to the channel length of at least the channel region can be removed by the etching process. Therefore, as the impurity region, which is a pass of electric charges, is removed, it can be prevented electric charges from being leaked from the source region to the drain region. As a result, correct switching of the semiconductor device is possible by switching on/off of the gate electrode.

According to a seventh aspect of the invention, there is provided a semiconductor device manufactured by the above method of manufacturing a semiconductor device. In this semiconductor device, the heavily doped source region and the heavily doped drain region are narrower than the lightly doped source region and the lightly doped drain region.

With this configuration, the impurity region immediately below the thick region of the resist can be reliably removed. Accordingly, as the impurity region, which is a pass of electric charges, is removed, it can be prevented electric charges from being leaked from the source region to the drain region. Accordingly, correct switching of the semiconductor device is possible by switching on/off of the gate electrode.

According to an eighth aspect of the invention, there is provided a method of manufacturing a semiconductor device including a semiconductor layer having a heavily doped source region, a heavily doped drain region, a lightly doped source region, a lightly doped drain region and a channel region, and a gate electrode opposite to the semiconductor layer with an insulating layer interposed therebetween, the method including forming a semiconductor film on a substrate; forming a resist on the semiconductor film such that a center portion of the resist is a flat portion and both ends of the resist is a tapered portion; forming a density gradient region and the channel region by injecting high density impurities into the semiconductor film through the tapered portion of the resist; etching the semiconductor film in a predetermined pattern using the resist as a mask; removing the resist from the semiconductor film to form a gate insulating layer on the semiconductor film; and forming the gate electrode at a position on the gate insulating layer which corresponds to the channel region or a portion of the channel region and the density gradient region.

With this configuration, since the resist is formed to have the taper shape, with the increase of the film thickness of the resist from the end of the semiconductor layer to the channel region, the injected impurities have a density gradient which is inversely proportional to the film thickness of the resist. That is, the density of the impurities becomes low gradually from the end of the semiconductor layer to the channel region. Therefore, by using the resist of the taper shape, impurity regions having a specific density gradient, for example, the heavily doped source and drain impurity regions and the lightly doped source and drain impurity regions, can be formed on the semiconductor layer by injecting the impurities into the semiconductor layer once.

Preferably, in the manufacturing method of the semiconductor device, a semiconductor device having the gate electrode formed at a position on the gate insulating layer which corresponds to the channel region and a semiconductor device having the gate electrode formed at a position on the gate insulating layer which corresponds to a portion of the channel region and the density gradient region are formed on the same substrate.

In the forming of the semiconductor device having the LDD and GOLD structures, by using the mask of the taper shape as a mask when the impurities are injected, the semiconductor device having the LDD and GOLD structures can be formed on the same substrate by injecting the impurities into the semiconductor layer once. In addition, all impurity regions of the semiconductor device having the LDD and GOLD structures can be formed in a self-alignment manner. Accordingly, an efficient manufacture process of the semiconductor device can be achieved.

Preferably, in the manufacturing method of the semiconductor device, a semiconductor device formed using the resist, a center portion of the resist being a flat portion and both ends of the resist being a tapered portion, and a semiconductor device formed using the resist having a thin region of the resist into which impurities are injected are formed on the same substrate.

By using the thin region of the resist corresponding to the heavily doped source and drain regions as a mask in forming the semiconductor device having the LDD structure, and by using the mask of the taper shape as a mask in forming the semiconductor device having the GOLD structure, the semiconductor device having the LDD and GOLD structures can be formed on the same substrate with the number of times of photolithography processes reduced as compared to the conventional method. Accordingly, an efficient manufacture process of the semiconductor device can be achieved.

According to a ninth aspect of the invention, there is provided a method of manufacturing a semiconductor device including a semiconductor layer having a heavily doped source region, a heavily doped drain region, a lightly doped source region, a lightly doped drain region and a channel region, and a gate electrode opposite to the semiconductor layer with an insulating layer interposed therebetween, the method comprising forming a semiconductor film on a substrate; forming a resist on the semiconductor film such that a center portion of the resist to be the channel region later is a flat portion, ends of the resist to be a heavily doped region are thinner than the flat portion, and a portion to be a density gradient region later between the flat portion and the thin ends has a tapered shape; etching the semiconductor film in a predetermined pattern using the resist as a mask; forming the channel region, the heavily doped region and the density gradient region on the semiconductor film by injecting high density impurities into the semiconductor film through the resist; removing the resist from the semiconductor film to form a gate insulating layer on the semiconductor film; and forming the gate electrode at a position on the gate insulating layer which corresponds to the channel region or a portion of the channel region and the density gradient region.

With this configuration, since the resist is formed to have the taper shape, with the increase of the film thickness of the resist from the heavily doped regions to the channel region, the injected impurities have a density gradient which is inversely proportional to the film thickness of the resist. That is, the density of the impurities becomes low gradually from the heavily doped regions to the channel region. Accordingly, by using the resist of the taper shape, impurity regions having a specific density gradient, for example, the heavily doped source and drain impurity regions and the lightly doped source and drain impurity regions, can be formed on the semiconductor layer by injecting the impurities into the semiconductor layer once.

Preferably, in the manufacturing method of the semiconductor device, a semiconductor device having the gate electrode formed at a position on the gate insulating layer which corresponds to the channel region and a semiconductor device having the gate electrode formed at a position on the gate insulating layer which corresponds to a portion of the channel region and the density gradient region are formed on the same substrate.

In the forming of the semiconductor device having the LDD and GOLD structures, by using the mask of the taper shape as a mask when the impurities are injected, the semiconductor device having the LDD and GOLD structures can be formed on the same substrate by injecting the impurities into the semiconductor layer once. In addition, all impurity regions of the semiconductor device having the LDD and GOLD structures can be formed in a self-alignment manner. Accordingly, an efficient manufacture process of the semiconductor device can be achieved.

Preferably, in the method of manufacturing the semiconductor device, a semiconductor device formed using the resist formed such that a center portion of the resist to be the channel region later is a flat portion, ends of the resist to be a heavily doped region are thinner than the flat portion, and a portion to be a density gradient region later between the flat portion and the thin ends has a tapered shape and a semiconductor device formed using the resist having a thin region of the resist into which impurities are injected are formed on the same substrate.

By using the thin region of the resist corresponding to the heavily doped source and drain regions as a mask in forming the semiconductor device having the LDD structure, and by using the mask of the taper shape as a mask in forming the semiconductor device having the GOLD structure, the semiconductor device having the LDD and GOLD structures can be formed on the same substrate with the number of times of photolithography processes reduced as compared to the conventional method. Therefore, an efficient manufacture process of the semiconductor device can be achieved.

According to a tenth aspect of the invention, there is provided a method of manufacturing a semiconductor device including a semiconductor layer having a heavily doped source region, a heavily doped drain region, a lightly doped source region, a lightly doped drain region and a channel region, and a gate electrode opposite to the semiconductor layer with an insulating layer interposed therebetween, the method including forming a semiconductor film on a substrate; in a first semiconductor device formation region, forming a resist on the semiconductor film such that a first portion of the resist corresponding to the heavily doped source region and the heavily doped drain region is thinner than a second portion of the resist corresponding to the channel region, the lightly doped source region and the lightly doped drain region; in a second semiconductor device formation region, forming a resist on the semiconductor film such that a third portion of the resist corresponding to the heavily doped source region, the heavily doped drain region, the lightly doped source region and the lightly doped drain region is thinner than a fourth portion of the resist corresponding to the channel region and is thicker than the first portion of the resist corresponding to the heavily doped source region and the heavily doped drain region in the first semiconductor device formation region; forming the heavily doped source region and the heavily doped drain region in the first semiconductor device formation region and forming the lightly doped source region, the lightly doped drain region and the channel region in the second semiconductor device formation region, by etching the semiconductor film in each of the first and second semiconductor device formation regions using the resists as masks and injecting high density impurities into the semiconductor film; removing the resist formed in each of the first and second semiconductor device formation regions from the semiconductor film and forming a gate insulating layer on the semiconductor film; in the first semiconductor device formation region, forming the gate electrode at a position on the gate insulating layer which corresponds to the channel region; in the second semiconductor device formation region, forming the gate electrode at a position on the gate insulating layer which corresponds to the channel region, the lightly doped source region and the lightly doped drain region; forming the lightly doped source region and the lightly doped drain region in the first semiconductor device formation region by injecting impurities having a density lower than the density of the high density impurities into the semiconductor film using the gate electrode in each of the first and second semiconductor device formation regions as a mask; and coating the entire surface of the first semiconductor device formation region with a resist and forming the heavily doped source region and the heavily doped drain region in the second semiconductor device formation region by injecting the high density impurities into the semiconductor film of the second semiconductor device formation region.

According to this aspect, by performing halftone exposure for the resist, the region through which impurities with high density pass, the region through which impurities with low density pass, and the region by which impurities are blocked are formed in the resist. That is, three patterns can be formed in the resist by the halftone exposure. By using the mask in forming the semiconductor device having the LDD and GOLD structures, the LDD and GOLD structures can be formed on the same substrate with the number of times of photolithography processes reduced as compared to the conventional method. Accordingly, an efficient manufacture process of the semiconductor device can be achieved.

According to an eleventh aspect of the invention, there is provided a method of manufacturing a semiconductor device including a semiconductor layer having a heavily doped source region, a heavily doped drain region, a lightly doped source region, a lightly doped drain region, and a channel region, and a gate electrode opposite to the semiconductor layer with an insulating layer interposed therebetween, the method including forming a semiconductor film on a substrate; forming a resist on the semiconductor film such that a first portion of the resist corresponding to the source region and the drain region is thinner than a second portion of the resist corresponding to the channel region; forming the source region and the drain region by etching the semiconductor film in a predetermined pattern using the resist as a mask and injecting impurities into the semiconductor film through the resist; removing the resist from the semiconductor film to form a gate insulating layer on the semiconductor film; and forming the gate electrode at a position on the gate insulating layer.

According to this aspect, there is provided a method of simplifying the process of manufacturing a semiconductor device having an LDD or GOLD structure.

According to an twelfth aspect of the invention, there is provided a semiconductor device manufactured by the above-mentioned method of manufacturing a semiconductor device.

According to this aspect, since the heavily doped source and drain regions have the same width from the end portion of the semiconductor layer, the semiconductor device having specific electrical characteristics can be attained.

Further, according to a thirteenth aspect of the invention, there is provided an electro-optical device comprising the above-mentioned semiconductor device.

In this case, it is possible to manufacture an electro-optical device by reducing the number of the manufacturing processes. The electro-optical device generally includes devices for converting electric energy into optical energy as well as devices having an electro-optical effect of change of transmittance of light due to change of refractive index of material by an electric field.

BRIEF DESCRIPTION OF THE DRAWINGS

The invention will be described with reference to the accompanying drawings, wherein like numbers reference like elements, and wherein:

FIGS. 8A and 8B are diagrams illustrating a method of manufacturing a semiconductor device according to a fourth embodiment of the present invention;

FIGS. 9A and 9B are diagrams illustrating a method of manufacturing a semiconductor device according to a fifth embodiment of the present invention;

FIGS. 10A and 10B are diagrams illustrating a method of manufacturing a semiconductor device according to a sixth embodiment of the present invention;

DETAILED DESCRIPTION OF EMBODIMENTS

First Embodiment

Structure of Electro-Optical Device

The structure of an electro-optical device according to an embodiment of the present invention will be described with reference to FIGS. 1 to 3. In this embodiment, an active-matrix-type transmissive liquid crystal display device using a thin film transistor (TFT) serving as a switching element will be described by way of an example.

Figure 1:
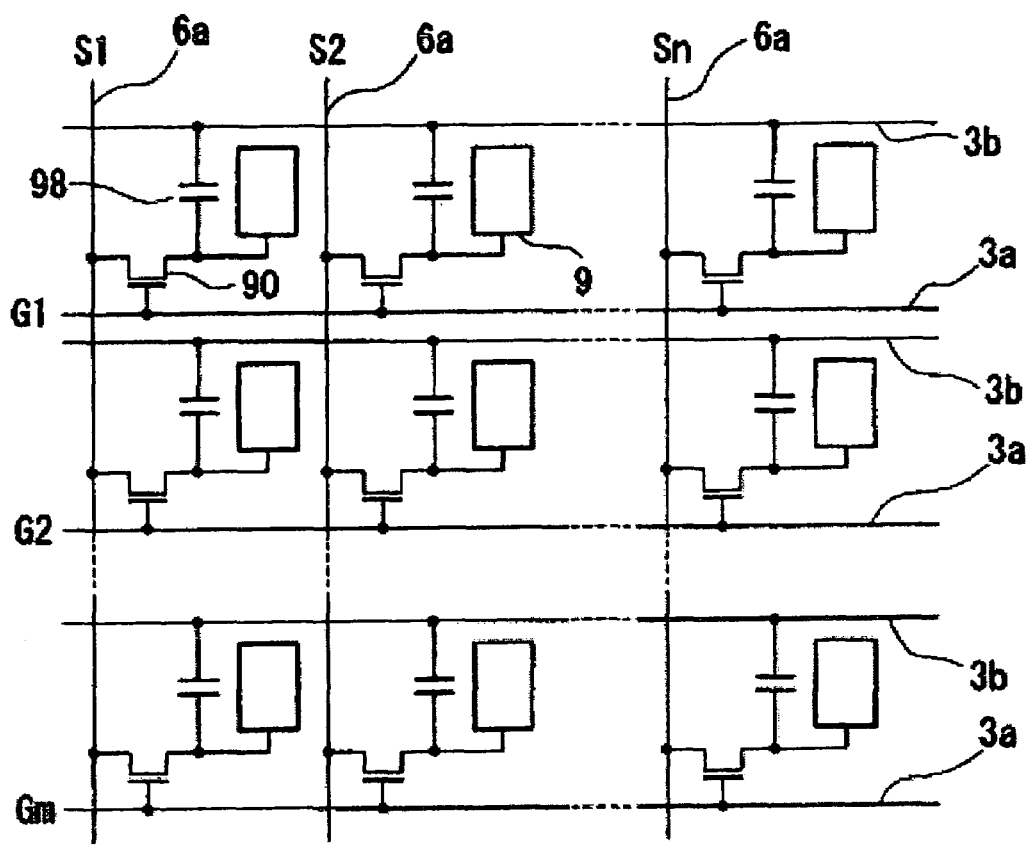
FIG. 1 is an equivalent circuit diagram of a liquid crystal display device according to an embodiment of the present invention.
Figure 2:
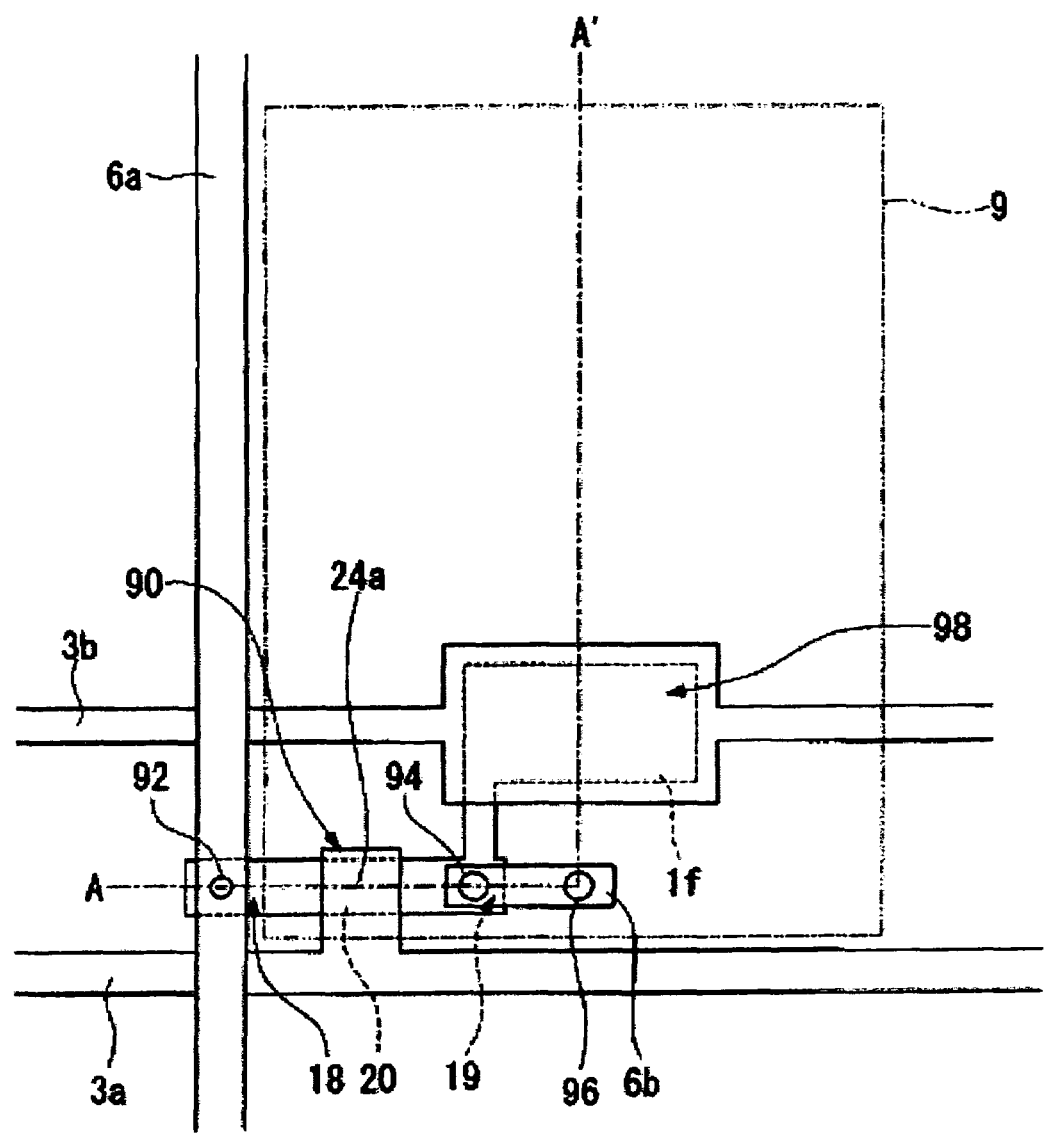
FIG. 2 is an enlarged plan view of one pixel of a TFT array substrate of the liquid crystal display device according to the embodiment.
Figure 3:
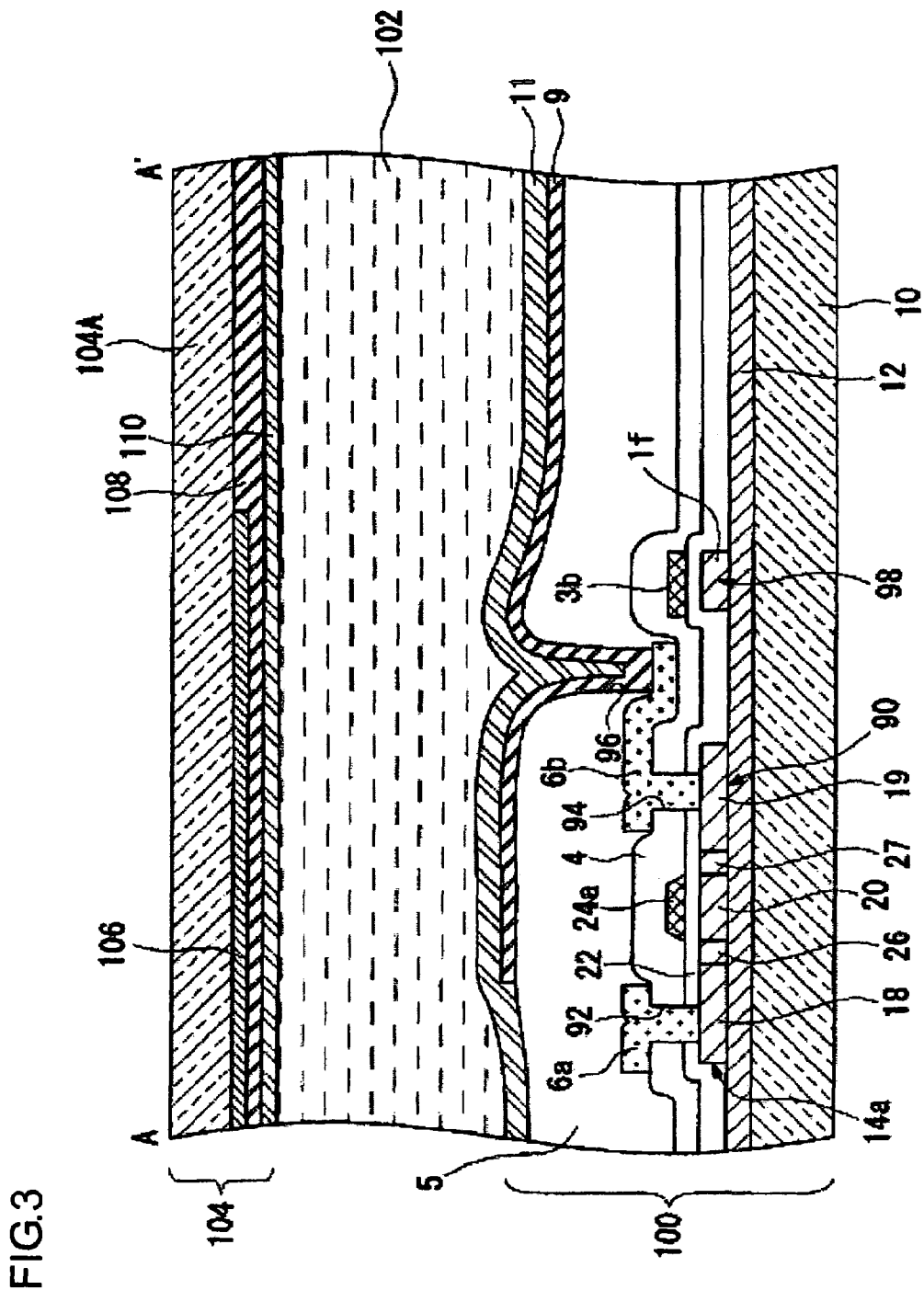
FIG. 3 is a sectional view taken along the line III-III in the liquid crystal display device of FIG. 2.

FIG. 1 is an equivalent circuit diagram of switching elements, signal lines, etc. in a plurality of pixels, which are arranged in a matrix, constituting an image display region of a liquid crystal display device according to the embodiment of the present invention, FIG. 2 is an enlarged plan view of one pixel of a TFT array substrate on which data lines, scanning lines, pixel electrodes, etc. are formed, and FIG. 3 is a sectional view taken along the line III-III in FIG. 2, showing the structure of the liquid crystal display device according to the embodiment. In addition, in FIG. 3, the top side indicates a light incident side and the bottom side indicates a viewing side (observer side). In addition, these figures have different scales for the layers and members so that the layers and members are shown at recognizable sizes.

In the liquid crystal display device according to this embodiment, as shown in FIG. 1, the plurality of pixels, which are arranged in the matrix and constitute the image display region, have pixel electrodes 9 and TFTs 90 serving as switching elements for controlling the pixel electrodes 9. A plurality of data lines 6a to which image signals are supplied are electrically connected to source electrodes of the TFTs 90, respectively. The image signals S1, S2, . . . , and Sn are sequentially supplied to the data lines 6a or are supplied to each of groups of adjacent data lines 6a.

In addition, a plurality of scanning lines 3a are electrically connected to gate electrodes of the TFTs 90. Scanning signals G1, G2, . . . , and Gm are line-sequentially applied in the form of a pulse to the plurality of scanning lines 3a at a predetermined timing. In addition, the pixel electrodes 9 are electrically connected to drain electrodes of the TFTs 90. The image signals S1, S2, . . . , and Sn supplied from the data lines 6a are written at a predetermined timing by turning on the TFTs 90 serving as the switching elements just for a predetermined period of time.

The image signals S1, S2, . . . , and Sn having a predetermined level, written in liquid crystal through the pixel electrodes 9, are held between the pixel electrode 9 and a common electrode, which will be described later, for a certain period of time. The alignment or order of liquid crystal molecules of the liquid crystal is varied according to the level of a voltage applied to the liquid crystal, and the liquid crystal modulates light to allow gray scale display. Here, in order to prevent the held image signals from leaking, a storage capacitor 98 is provided parallel to a liquid crystal capacitor formed between the pixel electrode 9 and the common electrode.

As shown in FIG. 3, the liquid crystal display device according to this embodiment generally includes a TFT array substrate 100 in which the TFT 90 and the pixel electrode 9 are formed and a counter substrate 104 in which a common electrode 108 is formed, with a liquid crystal layer 102 interposed therebetween.

Hereinafter, a planar structure of the TFT array substrate 100 will be described with reference to FIG. 2.

In the TFT array substrate 100, the plurality of rectangular pixel electrodes 9 are arranged in the matrix, and, as shown in FIG. 2, the data line 6a, the scanning line 3a, and a capacitor line 3b are arranged along vertical and horizontal boundaries of the pixel electrode 9. In this embodiment, a region in which the pixel electrode 9 and the data line 6a, the scanning line 3a and the like, which are arranged to surround the pixel electrode 9, are formed is defined as a pixel.

The data line 6a is electrically connected to a source region 18 of a polycrystalline semiconductor layer 14a constituting the TFT 90 via a contact hole 92, and the pixel electrode 9 is electrically connected to a drain region 19 of the polycrystalline semiconductor layer 14a via a contact hole 96, a source line 6b, and a contact hole 94. In addition, a portion of the scanning line 3a extends in the width direction of the scanning line such that that portion of the scanning line 3a is opposite to a channel region 20 of the polycrystalline semiconductor layer 14a. The extended portion of the scanning line 3a serves as a gate electrode. Hereinafter, in the scanning line 3a, the portion serving as the gate electrode is simply referred to as 'a gate electrode', which is denoted by a reference numeral 24a. In addition, the polycrystalline semiconductor layer 14a constituting the TFT 90 extends to a portion 1f opposite to the capacitor line 3b, and the storage capacitor (storage capacitive element) 98 having the portion 1f serving as a lower electrode and the capacitor line 3b serving as an upper electrode is thus formed.

Next, a sectional structure of the liquid crystal display device of this embodiment will be described with reference to FIG. 3.

The TFT array substrate 100 includes, as essential elements, a substrate main body (transparent substrate) 10 made of a transparent material, such as glass or the like, the pixel electrode 9 formed below the liquid crystal layer 102, the TFT 90, and an alignment film 11. The counter substrate 104 includes, as essential elements, a substrate main body 104A made of a transparent material, such as glass or the like, the common electrode 108 formed on the top of the liquid crystal layer 102, and an alignment film 110.

Specifically, in the TFT array substrate 100, a base protective layer (buffer layer) 12 made of a silicon oxide film is formed right above the substrate main body 10. In addition, below the liquid crystal layer 102 of the substrate main body 10, the pixel electrode 9 made of transparent conductive material, such as an indium tin oxide (ITO) or the like, is provided, and a pixel switching TFT 90 for controlling switching of the pixel electrode 9 is formed adjacent to the pixel electrode 9.

The polycrystalline semiconductor layer 14a made of polycrystalline silicon is formed on the base protective layer 12 in a predetermined pattern, a gate insulating layer 22 made of a silicon oxide or the like is formed on the polycrystalline semiconductor layer 14a, and the scanning line 3a (including the gate electrode 24a) is formed on the gate insulating layer 22. In this embodiment, the lateral side of the gate electrode 24a has a tapered shape with respect to the surface of the gate insulating layer 22. In addition, in the polycrystalline semiconductor layer 14a, a region opposite to the gate electrode 24a with the gate insulating layer 22 interposed therebetween forms the channel region 20 in which a channel is formed by an electric field from the gate electrode 24a. In addition, in the polycrystalline semiconductor layer 14a, the source region 18 is formed at one side (the left side in the drawing) of the channel region 20 and the drain region 19 is formed at the other side (the right side in the drawing) of the channel region 20. In addition, the pixel switching TFT 90 is formed by the gate electrode 24a, the gate insulating layer 22, the data line 6a, the source line 6b, the source region 18, the channel region 20 and the drain region 19 of the polycrystalline semiconductor layer 14a, and the like.

In this embodiment, the pixel switching TFT 90 has the LDD structure in which the source region 18 and the drain region 19 have relatively heavily doped impurity regions (a heavily doped source region and a heavily doped drain region) and relatively lightly doped impurity regions (LDD regions: a lightly doped source region and a lightly doped drain region). Hereinafter, the heavily doped source region and the lightly doped source region are denoted by reference numerals 18 and 26, respectively, and the heavily doped drain region and the lightly doped drain region are denoted by reference numerals 19 and 27, respectively.

In addition, a first interlayer insulating layer 4 made of a silicon oxide film or the like is formed on the substrate main body 10 on which the scanning line 3a (including the gate electrode 24a) is formed, and the data line 6a and the source line 6b are formed on the first interlayer insulating layer 4. The data line 6a is electrically connected to the heavily doped source region 18 of the polycrystalline semiconductor layer 14a via a contact hole 92 formed in the first interlayer insulating layer 4, and the source line 6b is electrically connected to the heavily doped drain region 19 of the polycrystalline semiconductor layer 14a via the contact hole 94 formed in the first interlayer insulating layer 4.

In addition, a second interlayer insulating layer 5 made of a silicon nitride film or the like is formed on the first interlayer insulating layer 4 on which the data line 6a and the source line 6b are formed, and the pixel electrode 9 is formed on the second interlayer insulating layer 5. The pixel electrode 9 is electrically connected to the source line 6b via the contact hole 96 formed in the second interlayer insulating layer 5.

In addition, the portion 1f (lower electrode) extending from the heavily doped drain region 19 of the polycrystalline semiconductor layer 14a is arranged opposite to the capacitor line 3b (upper electrode) formed in the same layer as the scanning line 3a, with an insulating layer (dielectric layer), which is integrated with the gate insulating layer 22, interposed therebetween. The extending portion 1f and the capacitor line 3b forms the storage capacitor 98.

In addition, an alignment film 11 for controlling the arrangement of the liquid crystal molecules included in the liquid crystal layer 102 is formed on the uppermost surface of the TFT array substrate 100, that is, on the bottom of the liquid crystal layer 102.

On the other hand, in the counter substrate 104, on a surface of the substrate main body 104A toward the liquid crystal layer 102 is formed a light shielding layer 106 for preventing light incident on the liquid crystal display device from being introduced into at least the channel region 20 and the lightly doped source and drain regions 26 and 27 of the polycrystalline semiconductor layer 14a. In addition, the common electrode 108 made of ITO or the like is formed on nearly the entire surface of the substrate main body 104A on which the light shielding layer 106 is formed, and an alignment film 110 for controlling the arrangement of the liquid crystal molecules included in the liquid crystal layer 102 is formed on the common electrode 108 at the liquid crystal layer 102 side. Method of manufacturing thin film semiconductor device FIGS. 4A to 4C and FIGS. 5A to 5C are schematic sectional views illustrating a method of manufacturing an n-channel TFT having the LDD structure, according to an embodiment of the present invention.

Figure 4A:
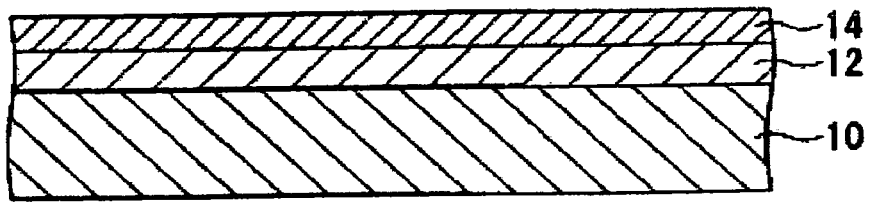
FIGS. 4A to 4C are diagrams illustrating a method of manufacturing a semiconductor device according to a first embodiment of the present invention.

To begin with, as shown in FIG. 4A, a light transmitting substrate, such as a glass substrate, cleaned through an ultrasonic washing process is prepared as the substrate 10. Thereafter, under a condition where the temperature of the surface of the substrate is 150 to 450° C., the base protective layer (buffer layer) 12 made of a silicon oxide film or the like is formed at a thickness of 100 to 500 nm on the entire surface of the substrate 10 using a plasma CVD method or the like. As raw gases used in this process, a mixed gas of monosilane and dinitrogen monoxide, TEOS (tetraethyl orthosilicate, $Si(OC_2H_5)_4$), oxygen, disilane, ammonia, or the like are very suitable.

Next, as shown in FIG. 4A, an amorphous semiconductor layer 14 made of amorphous silicon is formed at a thickness of 30 to 100 nm on the entire surface of the base protective layer 12 using a plasma CVD method or the like. As raw gases used in this process, disilane or monosilane is very suitable. Next, by performing a laser annealing process or the like for the amorphous semiconductor layer 14, the amorphous semiconductor layer 14 is polycrystallized to form the polycrystalline semiconductor layer 14a made of polycrystalline silicon.

Figure 4B:
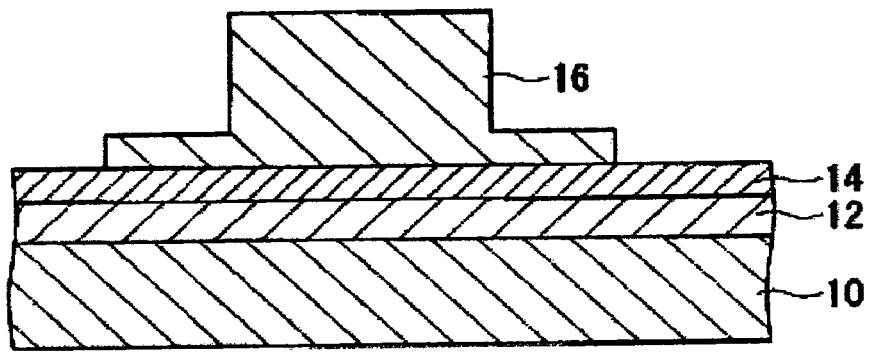

Next, as shown in FIG. 4B, a photoresist 16 is formed on the polycrystalline semiconductor layer 14a and is patterned in a predetermined shape using a photolithography method. Here, for the photolithography method, a halftone mask is used as a predetermined pattern mask or reticle for transfer exposure to the photoresist 16. The halftone mask has a portion for shielding exposure light irradiated from an exposure system, a portion for fully transmitting the exposure light, and a portion for partially transmitting the exposure light. A diffraction grating pattern consisting of slits and the like for controlling the amount of transmission of the exposure light is provided in the portion of the mask or reticle for partially transmitting the exposure light.

In this manner, in the exposure process, the photoresist 16 is shaped using the halftone mask, such that a region of the photoresist 16 corresponding to the heavily doped source region 18 and the heavily doped drain region 19 of the polycrystalline semiconductor layer 14a has a film thickness smaller than that of a region of the photoresist 16 corresponding to the channel region 20a. That is, the region of the photoresist 16 having smaller film thickness is formed at a film thickness such that, when impurity ions with high density are injected into the polycrystalline semiconductor layer 14a, the impurity ions pass through the photoresist 16 while maintaining the high density and are injected into the highly doped source region 18 and the highly doped drain region 19. The film thickness of such a region of the photoresist 16 is preferably 50 nm to 200 nm, for example.

On the other hand, the region of the photoresist 16 corresponding to the channel region 20a other than the highly doped source region 18 and the highly doped drain region 19 of the polycrystalline semiconductor layer 14a has a film thickness such that, when impurity ions with high density are injected into the polycrystalline semiconductor layer 14a, the impurity ions are blocked by the photoresist 16, and accordingly, do not arrive at the polycrystalline semiconductor layer 14a. The film thickness of such a region of the photoresist 16 is preferably more than 200 nm, for example.

In addition, the channel region 20a is a region corresponding to the lightly doped source region 26, the lightly doped drain region 27, and the channel region 20, which will be described later.

Figure 4C:
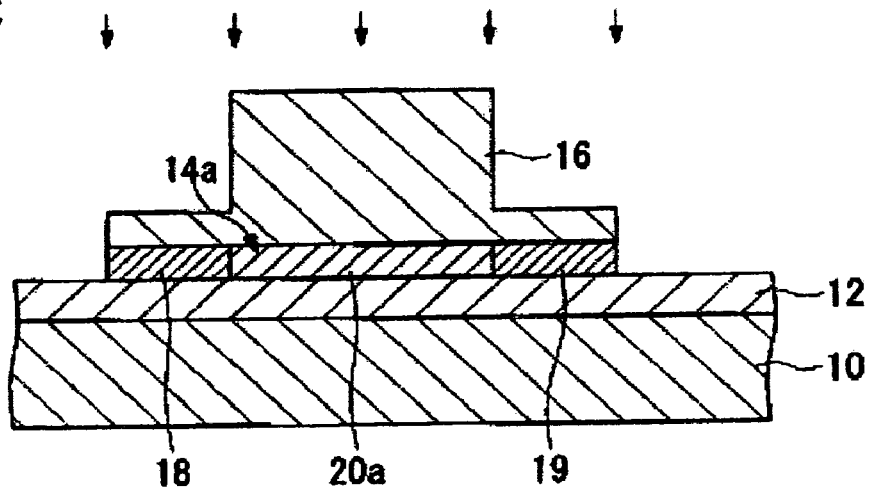

Next, as shown in FIG. 4C, the polycrystalline semiconductor layer 14a formed below the photoresist 16 is etched into a predetermined shape using the photoresist 16 patterned in the predetermined shape as a mask. Various etching methods, including dry etching and wet etching may be used for this etching process.

Subsequently, as shown in FIG. 4C, using the photoresist 16 as the mask, the high density impurity ions (for example, phosphorus ions) are injected at a dose of about $0.1 \times 10^{15}$ to $10 \times 10^{15}/cm^2$, for example, into the polycrystalline semiconductor layer 14a. Therefore, the high density impurity ions pass through the region of the photoresist 16 having the thin film thickness while maintaining the high density and are injected into the polycrystalline semiconductor layer 14a. In this manner, using the photoresist 16 as the mask, the heavily doped source region 18 and the heavily doped drain region 19 can be formed in the polycrystalline semiconductor layer 14a in a self-aligned manner. On the other hand, in the region of the photoresist 16 having the thick film thickness, the high density impurity ions are blocked such that they do not arrive at the polycrystalline semiconductor layer 14a. The region into which impurity ions with specific density are not injected becomes the channel region 20a constituted by the polycrystalline semiconductor layer 14a into which impurities are not added.

In addition, the etching process for the polycrystalline semiconductor layer 14a is preferably performed after the impurity ions are injected therein.

This embodiment is characterized in that the photoresist 16 formed on the polycrystalline semiconductor layer 14a is directly patterned in the predetermined shape and the high density impurity ions are injected into the polycrystalline semiconductor layer 14a using the patterned photoresist 16 as the mask, as described above. That is, the high-density impurity ions are injected into the polycrystalline semiconductor layer 14a before a gate insulating layer is formed, unlike the conventional techniques in which the high-density impurity ions are injected via the gate insulating layer formed in advance. Therefore, after the semiconductor device is formed, when comparing the density of impurities contained in the gate insulating layer 22 in this embodiment with the density of impurities contained in the gate insulating layer in the conventional techniques, it can be seen that the gate insulating layer in the conventional techniques contains impurities with higher density. Therefore, if the density of the impurities contained in the gate insulating layer is more than $1 \times 10^{14}/cm^2$, it can be seen that high-density impurity ions are injected through the gate insulating layer.

Figure 5A:
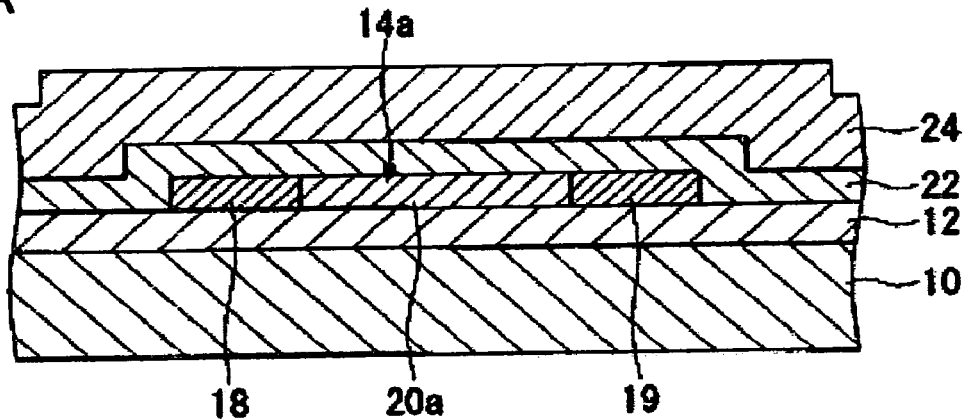
FIGS. 5A to 5C are diagrams illustrating a method of manufacturing the semiconductor device according to the first embodiment.

Next, as shown in FIG. 5A, the photoresist 16 formed on the polycrystalline semiconductor layer 14a is removed, and after curing the surface of the polycrystalline semiconductor by hydrofluoric acid, the gate insulating layer 22 is formed on the entire surface of the substrate 10, including the polycrystalline semiconductor layer 14a, using a plasma CVD method, a sputtering method, or the like. Subsequently, a conductive layer 24 serving as the gate electrode, which will be described later, is formed on the entire surface of the gate insulating layer 22.

Figure 5B:
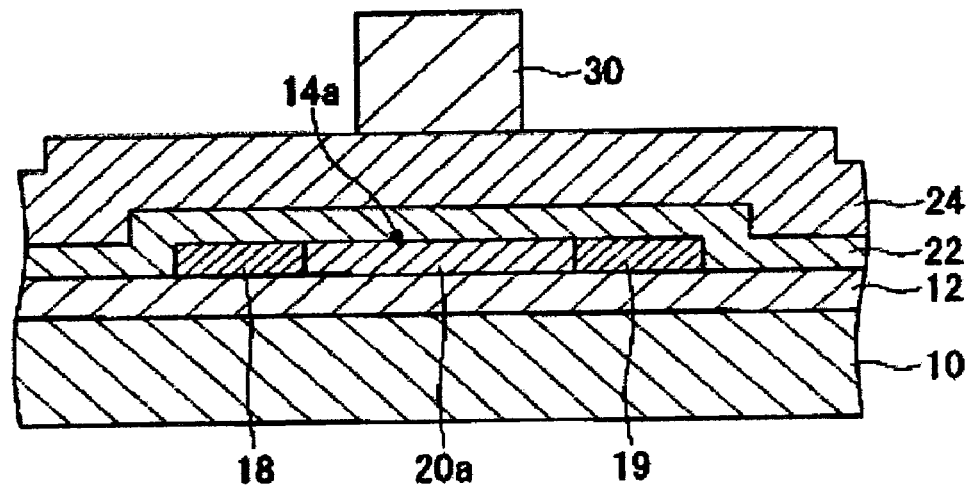

Next, as shown in FIG. 5B, a photoresist 30 is formed on the entire surface of the conductive layer 24, and then, the photoresist 30 is exposed, developed, and patterned in a predetermined shape using photolithography. Here, the photoresist 30 is narrower than the channel region 20a of FIG. 5B formed below the photoresist 30 and is aligned such that the lightly doped source and drain regions 26 and 27, which will be described later, are formed on both ends of the channel region 20a.

Figure 5C:
Figure 5C:
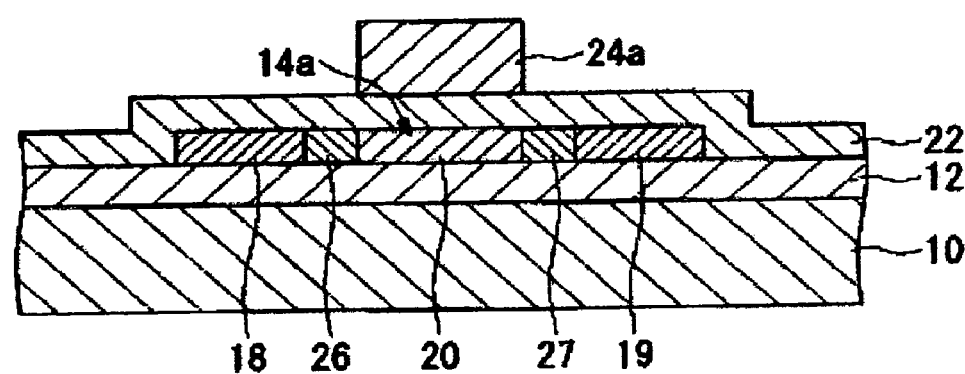

Next, as shown in FIG. 5C, using the photoresist 30 patterned in the predetermined shape as a mask, the conductive layer 24 is etched to form the gate electrode 24a.

Subsequently, using the gate electrode 24a as a mask, impurity ions (phosphorus ions) with low density are injected at a dose of about $0.1 \times 10^{13}$ to $10 \times 10^{13}/cm^2$, for example, and the lightly doped source region 26 and the lightly doped drain region 27 are formed at both ends of the channel region 20 of the polycrystalline semiconductor layer 14a, respectively. In this manner, the semiconductor device having a so-called LDD structure is formed.

In the semiconductor device having the LDD structure manufactured according to the above-described processes, the heavily doped source region 18 and the heavily doped drain region 19 have the same width at both ends of the polycrystalline semiconductor layer 14a. In addition, the heavily doped source region 18 and the heavily doped drain region 19 of the polycrystalline semiconductor layer 14a are formed to be smaller thickness than the lightly doped source region 26, the lightly doped drain region 27, and the channel region 20, for the difference of etching rate of hydrofluoric acid treatment to the polycrystalline semiconductor before forming the gate insulating layer.

As described above, in this embodiment, after the photoresist 16 is directly formed on the semiconductor layer, the regions of the photoresist 16 corresponding to the heavily doped source region 18 and the heavily doped drain region 19 are thinly formed in the predetermined shape using photolithography. Accordingly, using the photoresist 16 as the mask, the polycrystalline semiconductor layer 14a can be etched in the predetermined shape, and then, using the photoresist 16 as the mask again, the impurities with the specific density can be injected into the semiconductor layer. That is, the photoresist 16 having the predetermined shape, which is formed using the photolithography process once, can be used as the mask for both processes of etching the polycrystalline semiconductor layer 14a and injecting the impurities. Therefore, the number of the photolithography steps can be reduced by one as compared to the conventional techniques. In addition, a process accompanying the photolithography process, for example, a process of removing the photoresist 16, can also be reduced.

In addition, since the impurities are directly injected into the polycrystalline semiconductor layer 14a using the photoresist 16 as the mask, the impurities can be injected without the gate insulating layer 22 formed on the polycrystalline semiconductor layer 14a intervening. Therefore, the gate insulating layer 22 can be prevented from being damaged due to the injection of the impurities, which results in the gate insulating layer 22 having high reliability and good insulating properties.

In addition, since the heavily doped source region 18 and the heavily doped drain region 19 are formed using the photoresist 16 as the mask, and the lightly doped source region 26 and the lightly doped drain region 27 are formed using the gate electrode 24a as the mask, all impurity regions can be formed in a self-aligned manner.

In addition, before the polycrystalline semiconductor layer 14a is patterned in the predetermined shape, the heavily doped source region 18 and the heavily doped drain region 19 to be formed on the polycrystalline semiconductor layer 14a can be set. Therefore, when the impurities are injected into the polycrystalline semiconductor layer 14a to form the heavily doped source region 18 and the heavily doped drain region 19, the heavily doped source region 18 and the heavily doped drain region 19 can be formed in the polycrystalline semiconductor layer 14a with high precision without requiring alignment of the mask with the polycrystalline semiconductor layer 14a.

Second Embodiment

Next, a method of forming a semiconductor device having a GOLD structure, according to an embodiment of the present invention, will be described with reference to FIGS. 6A to 6C.

Figure 6A:
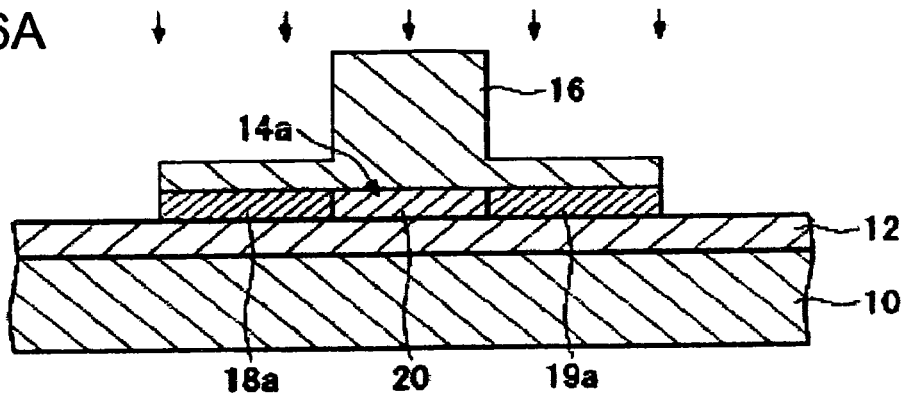
FIGS. 6A to 6D are diagrams illustrating a method of manufacturing a semiconductor device according to a second embodiment of the present invention.
Figure 6B:
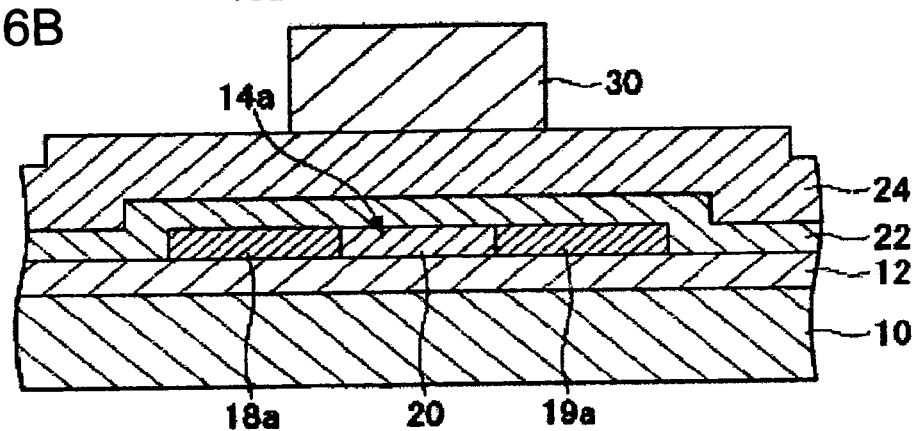
Figure 6C:
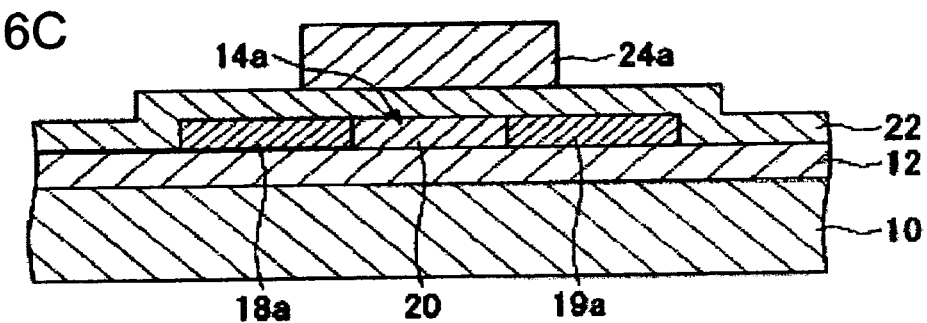

FIGS. 6A to 6C are schematic sectional views illustrating a method of manufacturing an n-channel TFT having the GOLD structure, according to the embodiment of the present invention. In these figures, the description of the same processes as the first embodiment will be omitted or simplified, and the same constituent elements as the first embodiment are denoted by the same reference numerals.

To begin with, as shown in FIG. 6A, the base protective layer 12 is formed on the entire surface of the substrate 10, and then, the polycrystalline semiconductor layer 14a is formed on the base protective layer 12. Next, the photoresist 16 is formed on the polycrystalline semiconductor layer 14a and then is patterned in a predetermined shape. As a shape of pattern of the photoresist 16, a region of the photoresist 16 corresponding to a source region 18a and a drain region 19a of the polycrystalline semiconductor layer 14a shown in FIG. 6A is thinly formed using the halftone mask as described above. That is, the photoresist 16 is formed at a film thickness in such a manner that, when impurity ions with low density are injected into the polycrystalline semiconductor layer 14a, the impurity ions pass through the photoresist 16 while maintaining the low density and are injected into the source region and the drain region. The film thickness of such a region of the photoresist 16 is preferably 50 nm to 200 nm, for example.

On the other hand, a region of the photoresist 16 corresponding to the channel region 20 other than the source region 18a and the drain region 19a of the polycrystalline semiconductor layer 14a has a film thickness in such a manner that, when impurity ions with low density are injected into the polycrystalline semiconductor layer 14a, the impurity ions are blocked by the photoresist 16, and accordingly, do not arrive at the polycrystalline semiconductor layer 14a. The film thickness of such a region of the photoresist 16 is preferably more than 200 nm, for example.

In addition, the source region 18a is a region corresponding to the heavily doped source region 18 and the lightly doped source region 26, which will be described later. In addition, the drain region 19a is a region corresponding to the heavily doped drain region 19 and the lightly doped drain region 27, which will be described later.

Next, as shown in FIG. 6A, the polycrystalline semiconductor layer 14a formed below the photoresist 16 is etched into a predetermined shape using the photoresist 16 patterned in the predetermined shape as a mask. Various etching methods including dry etching and wet etching may be used for this etching process.

In addition, the etching process for the polycrystalline semiconductor layer 14a is preferably performed after the impurity ions are injected therein.

Next, using the photoresist 16 as the mask, the low density impurity ions (for example, phosphorus ions) are injected at a dose of about $0.1 \times 10^{13}$ to $10 \times 10^{13}/cm^2$, for example, into the polycrystalline semiconductor layer 14a. In this manner, as shown in FIG. 6A, the source region 18a and the drain region 19a into which the impurities with low density are injected are formed in the polycrystalline semiconductor layer 14a. At this time, a region positioned immediately below a thick portion of the photoresist 16 and into which the impurity ions are not injected becomes the channel region 20. In this manner, using the photoresist 16 as the mask, the source region 18a and the drain region 19a, which are low density impurity regions, can be formed in the polycrystalline semiconductor layer 14a in a self-alignment manner.

Next, the photoresist 16 formed on the polycrystalline semiconductor layer 14a is removed. Next, as shown in FIG. 6B, the gate insulating layer 22 is formed on the entire surface of the substrate 10 including the polycrystalline semiconductor layer 14a using a plasma CVD method, a sputtering method or the like. Subsequently, the conductive layer 24 serving as the gate electrode, which will be described later, is formed on the entire surface of the gate insulating layer 22.

Next, as shown in FIG. 6B, the photoresist 30 is formed on the entire surface of the conductive layer 24, and then, the photoresist 30 is exposed, developed, and patterned in a predetermined shape using a photolithography method. The photoresist 30 is formed to be larger than the channel region 20 formed below the photoresist 30, as shown in FIG. 6B, such that a portion of the photoresist 16 overlaps the source region 18a and the drain region 19a formed in both ends of the channel region 20. That is, a gate electrode 24a shown in FIG. 6D overlaps the source region 18a and the drain region 19a immediately below the gate electrode 24a.

Next, as shown in FIG. 6C, using the photoresist 30 patterned in the predetermined shape as a mask, the conductive layer 24 is etched to form the gate electrode 24a.

Figure 6D:
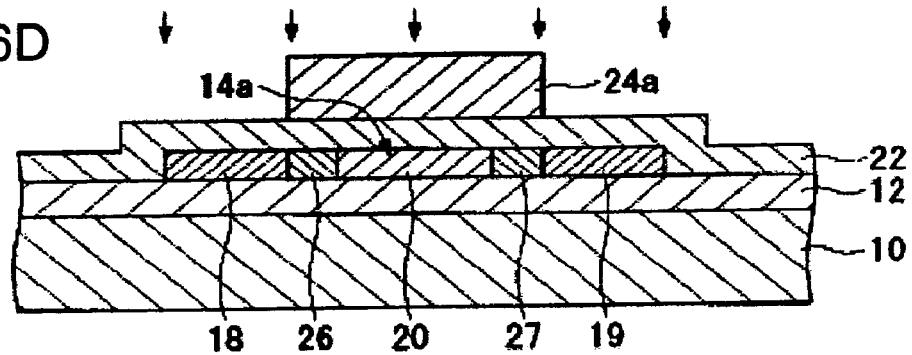

Subsequently, as shown in FIG. 6D, using the gate electrode 24a as a mask, impurity ions (phosphorus ions) with high density are injected at a dose of about $0.1 \times 10^{15}$ to $10 \times 10^{15}/cm^2$, for example. In this manner, the impurity ions with high density are injected into a region of the polycrystalline semiconductor layer 14a, which is not coated with the gate electrode 24a, to thereby form the heavily doped source region 18 and the heavily doped drain region 19. On the other hand, since the impurity ions are blocked by a region of the polycrystalline semiconductor layer 14a, which is coated with the gate electrode 24a and positioned immediately below the gate electrode 24a, the channel region 20 and the lightly doped source region 26 and the lightly doped drain region 27 at both ends of the channel region 20 are formed. In this embodiment, unlike the first embodiment, the gate electrode 24a overlaps the lightly doped source region 26 and the lightly doped drain region 27 immediately below the gate electrode 24a, thereby forming the semiconductor device having a so-called GOLD structure.

As described above, using the processes described in connection with the second embodiment, the semiconductor device having the GOLD structure can be formed by changing a sequence of the process of impurity ion injection and overlapping the lightly doped source region 26 and the lightly doped drain region 27 up to the gate electrode 24a.

Third Embodiment

Next, a method of simultaneously forming a semiconductor device having an LDD structure and a semiconductor device having a GOLD structure on the same substrate, according to an embodiment of the present invention, will be described with reference to FIGS. 7A to 7C. In these figures, the description of the same processes as the first and second embodiments will be omitted or simplified.

Figures 7A, 7B, 7C:
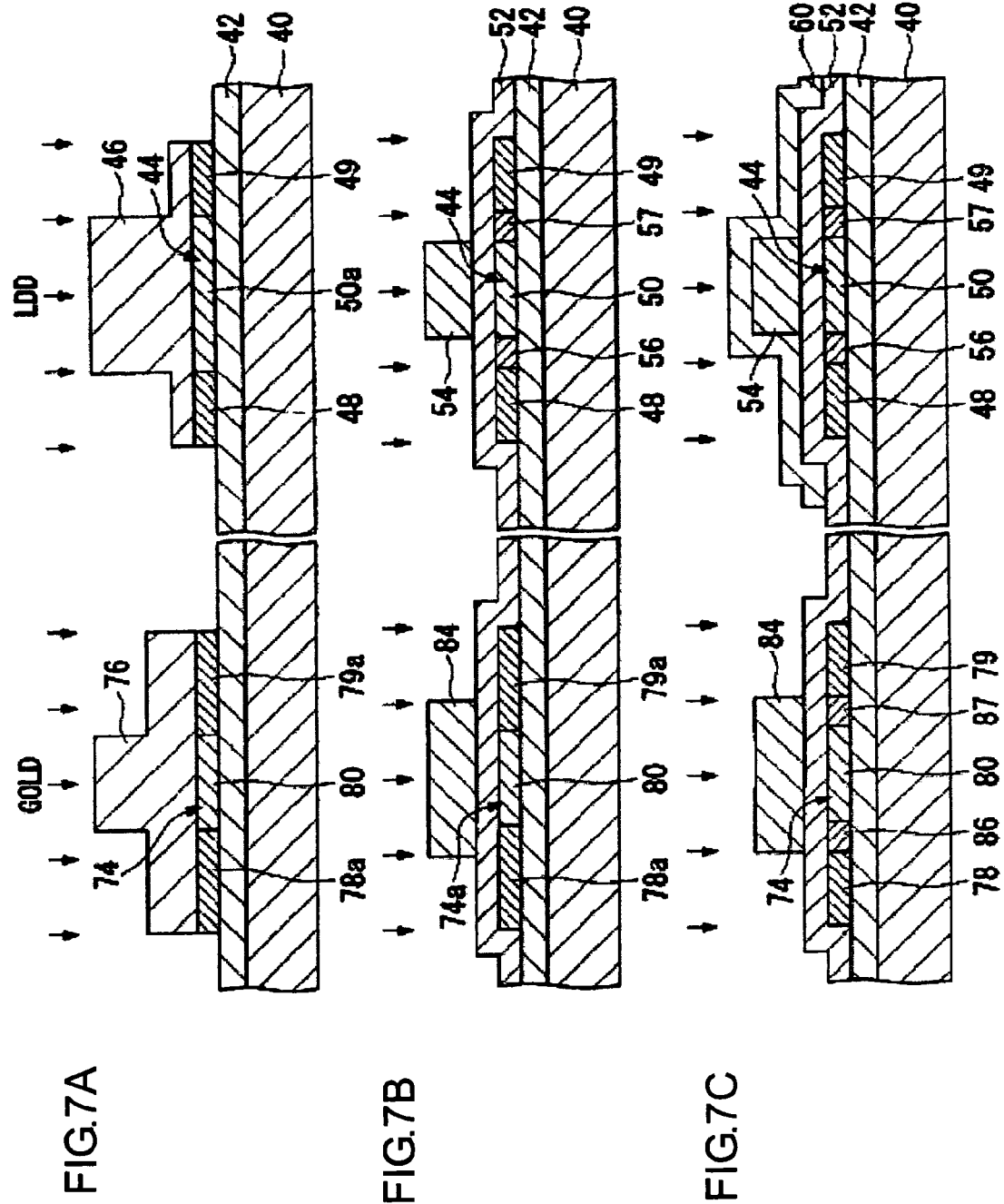
FIGS. 7A to 7C are diagrams illustrating a method of manufacturing a semiconductor device according to a third embodiment of the present invention.

FIGS. 7A to 7C are schematic sectional views illustrating a method of manufacturing an n-channel TFT having the LDD structure and the GOLD structure, according to the embodiment of the present invention. In these figures, a TFT region having the LDD structure shown in the right of the figures is an LDD formation region and a TFT region having the GOLD structure shown in the left of the figures is a GOLD formation region.

To begin with, as shown in FIG. 7A, a base protective layer 42 is formed on the entire surface of a substrate 40. Next, an amorphous semiconductor layer is annealed to be changed to a polycrystalline semiconductor layer 44. A photoresist is formed on the polycrystalline semiconductor layer 44. Next, the photoresist is patterned in a predetermined shape using the halftone mask as described above. In the LDD formation region, as a shape of pattern of the photoresist 46, a region of the photoresist 46 corresponding to a heavily doped source region 48 and a heavily doped drain region 49 is thinly formed, shown in FIG. 7A. The film thickness of the region of the photoresist 46 corresponding to the heavily doped source region 48 and the heavily doped drain region 49 is preferably 50 nm to 200 nm, for example. On the other hand, a region of the photoresist 46 corresponding to a channel region 50a of the polycrystalline semiconductor layer 44 has a film thickness in such a manner that, when impurity ions with high density are injected into the polycrystalline semiconductor layer 44, the impurity ions are blocked by the photoresist 46. The film thickness of such a region of the photoresist 46 is preferably more than 200 nm, for example.

In addition, the channel region 50a is a region corresponding to a lightly doped source region 56, a lightly doped drain region 57, and a channel region 50, which will be described later.

In addition, as shown in FIGS. 7A to 7C, in the GOLD formation region, as a shape of pattern of a photoresist 76, a region of the photoresist 76 corresponding to a source region 78a and a drain region 79a is thinly formed. Specifically, the region of the photoresist 76 corresponding to the source region 78a and the drain region 79a is formed to be thicker than the film thickness of the photoresist 46 in the LDD formation region and to be thinner than a channel region 80. At this time, a region of the photoresist 76 corresponding to the source region 78a and the drain region 79a of the photoresist 76 has a film thickness in such a manner that, when impurity ions with high density are injected into a polycrystalline semiconductor layer 74, the impurity ions pass through the photoresist 76 with low density and are injected into the source region and the drain region at the low density. That is, a portion of the impurity ions with high density is blocked by the photoresist 76 to thereby be changed to a low density state and arrives at the polycrystalline semiconductor layer 74.

On the other hand, a region of the photoresist 76 corresponding to the channel region 80 of the polycrystalline semiconductor layer 74 has a film thickness in such a manner that, when impurity ions with high density are injected into the polycrystalline semiconductor layer 74, the impurity ions are blocked by the photoresist 76. The film thickness of such a region of the photoresist 76 is preferably more than 200 nm, for example.

In addition, the source region 78a is a region corresponding to a heavily doped source region 78 and a lightly doped source region 86, which will be described later. In addition, the drain region 79a is a region corresponding to a heavily doped drain region 79 and a lightly doped drain region 87, which will be described later.

Next, the polycrystalline semiconductor layers 44 and 74 formed below the photoresists 46 and 76, respectively, are etched into a predetermined shape using the photoresists 46 and 76 patterned in the predetermined shape as a mask. In addition, the etching process for the polycrystalline semiconductor layers 44 and 74 is preferably performed after the impurity ions are injected therein.

Next, as shown in FIG. 7A, using each of the photoresists 46 and 76 as a mask, impurity ions (phosphorus ions) with high density are injected at a dose of about $0.1 \times 10^{15}$ to $10 \times 10^{15}/cm^2$, for example, into the polycrystalline semiconductor layer 44 and 74. Accordingly, in the LDD region, by injecting the impurities with high density into a region, having a small film thickness, of the photoresist 46, the heavily doped source region 48 and the heavily doped drain region 49 are formed in the polycrystalline semiconductor layer 44 in a self-alignment manner using the photoresist 46 as the mask. In addition, in a region of the polycrystalline semiconductor layer 44 immediately below the photoresist 46, since the impurities ions are blocked by using the photoresist 46 as a mask, the channel region 50a is formed without injection of the impurities ions into the polycrystalline semiconductor layer 44.

On the other hand, in the GOLD region, impurity ions with high density pass through the photoresist 76 with a low density state depending on the film thickness of the photoresist 76 and are injected into the polycrystalline semiconductor layer 74, with respect to a region in which the thickness of the photoresist 76 is small. In this manner, the source region 78a and the drain region 79a, which are low density impurity regions, are formed in the polycrystalline semiconductor layer 74 in a self-alignment manner using the photoresist 76 as the mask. In addition, in a region of the polycrystalline semiconductor layer 74 immediately below the photoresist 76, since the impurities ions are blocked by using the photoresist 76 as the mask, the channel region 80 is formed without injection of the impurities ions into the polycrystalline semiconductor layer 74.

Next, as shown in FIG. 7B, after injecting the impurities into the polycrystalline semiconductor layers 44 and 74, the photoresists 46 and 76 formed on the polycrystalline semiconductor layers 44 and 74 are removed. Next, a gate insulating layer 52 is formed on the polycrystalline semiconductor layers 44 and 74, and then, a conductive layer is formed on the gate insulating layer 52. Next, a photoresist is formed on the conductive layer, and then, the photoresist is patterned in a predetermined shape. Then, using the photoresist patterned in the predetermined shape as a mask, the conductive layer formed below the photoresist is etched. After etching, in the LDD formation region, a gate electrode 54 is formed at a position corresponding to the channel region 50. In addition, in the GOLD formation region, a gate electrode 84 is formed at a position corresponding to the channel region 80, the lightly doped source region 86, and the lightly doped drain region 87.

Next, as shown in FIG. 7B, using each of the gate electrodes 54 and 84 as a mask, impurity ions (phosphorus ions) with low density are injected at a dose of about $0.1 \times 10^{13}$ to $10 \times 10^{13}/cm^2$, for example, into the polycrystalline semiconductor layers 44 and 74, respectively.

Therefore, in the LDD formation region, the lightly doped source region 56 and the lightly doped drain region 57 are formed in both ends of the channel region 50, and the semiconductor device having the LDD structure can be formed. On the other hand, in the GOLD structure, since the impurities with low density are re-injected, the source region 78a and the drain region 79a into which the impurities are injected become low density impurity regions.

Next, as shown in FIG. 7C, in the LDD formation region, in order to protect the LDD formation region from the injection of the impurities with high density, a photoresist 60 is formed to coat the entire surface of the semiconductor device having the formed LDD structure. Next, in the GOLD formation region, using the gate electrode 84 as a mask, impurity ions (phosphorus ions) with high density are injected at a dose of about $0.1 \times 10^{15}$ to $10 \times 10^{15}/cm^2$, for example, into the polycrystalline semiconductor layer 74. As a result, a region which is not coated with the gate electrode 84 of the source region 78a and drain region 79a which are the low density impurity region becomes the heavily doped source region 78 and the heavily doped drain region 79 containing the high-density impurities. In addition, the gate electrode overlaps the lightly doped source region 86 and the lightly doped drain region 87 immediately below the gate electrode 84, thereby forming the semiconductor device having the GOLD structure.

According to this embodiment, the semiconductor devices having the LDD and GOLD structures depending on a required function can be formed on the TFT array substrate 100 of the liquid crystal display device on which various circuits are provided. For example, a semiconductor device with an LDD structure having a small off-current value is formed in a TFT serving as a switching element for driving a pixel electrode, while a semiconductor device with a GOLD structure having a superior hot carrier effect is formed in a TFT constituting a driving circuit provided in the periphery of pixels.

In addition, for the formation of the semiconductor devices having the LDD and GOLD structures, since a thin photoresist corresponding to the source region and the drain region is used as a mask, the LDD and GOLD structures can be formed on the same substrate at the same time by reducing the number of times of a photolithography process as compared to the conventional techniques. Therefore, an efficient manufacturing process of the semiconductor device can be achieved.

Fourth Embodiment

Next, similar to the third embodiment, a method of simultaneously forming a semiconductor device having an LDD structure and a semiconductor device having a GOLD structure on the same substrate will be described with reference to FIGS. 8A and 8B. In these figures, the description of the same processes as the first to third embodiments will be omitted or simplified.

FIGS. 8A and 8B are schematic sectional views illustrating a method of manufacturing an n-channel TFT having the LDD structure and the GOLD structure, according to the embodiment of the present invention. In these figures, a TFT region having the LDD structure shown in the right of the figures is an LDD formation region and a TFT region having the GOLD structure shown in the left of the figures is a GOLD formation region.

To begin with, as shown in FIG. 8A, the base protective layer 42 is formed on the entire surface of the substrate 40. Next, an amorphous semiconductor layer is annealed to be changed to the polycrystalline semiconductor layer 44. The photoresist 46 is formed on the polycrystalline semiconductor layer 44. Next, the photoresist 46 is patterned in a predetermined shape. In the LDD formation region, the photoresist 46 is formed to have a taper shape having a predetermined inclined angle using halftone exposure in such a manner that the photoresist 46 becomes thick in a direction from an end of the polycrystalline semiconductor layer 44 to the channel region 50. More specifically, the taper-shaped photoresist 46 is formed such that its center portion has a flat shape and its end has a taper shape.

Similarly, in the GOLD formation region, the photoresist 76 is formed to have a taper shape having a predetermined inclined angle using halftone exposure in such a manner that the photoresist 76 becomes thick in a direction from an end of the polycrystalline semiconductor layer 74 to the channel region 80.

Next, the polycrystalline semiconductor layers 44 and 74 formed below the photoresists 46 and 76 are etched into a predetermined shape using the photoresists 46 and 76 patterned in the predetermined shape as a mask. In addition, the etching process for the polycrystalline semiconductor layers 44 and 74 is preferably performed after the impurity ions are injected therein.

Next, as shown in FIG. 8A, using each of the photoresists 46 and 76 as a mask, impurity ions (phosphorus ions) with high density are injected at a dose of about $0.1 \times 10^{15}$ to $10 \times 10^{15}/cm^2$, for example, into the polycrystalline semiconductor layer 44 and 74, respectively.

According to such an injection, in the LDD formation region, as the photoresist 46 becomes thick gradually in a direction from the heavily doped source region 48 and the heavily doped drain region 49 of the polycrystalline semiconductor layer 44 to the channel region 50, density of impurities injected into a tape-shaped region of the photoresist 46 becomes low. As a result, as shown in FIG. 8A, in a region immediately below the photoresist 46 through which the impurities with high density can pass, the impurity ions with high density are injected into the polycrystalline semiconductor layer 44, and accordingly, the heavily doped source region 48 and the heavily doped drain region 49 are formed in the polycrystalline semiconductor layer 44. On the other hand, in a region immediately below the photoresist 46 through which the impurities with low density can pass, the impurity ions with low density are injected into the polycrystalline semiconductor layer 44, and accordingly, the lightly doped source region 56 and the lightly doped drain region 57 are formed in the polycrystalline semiconductor layer 44. The channel region 50 is formed immediately below the thickest region of the photoresist 46.

In addition, although the density gradient region is formed in the direction from both ends of the polycrystalline semiconductor layer 44 to the channel region 50, for matching with the first to third embodiments, it is described in this embodiment that the polycrystalline semiconductor layer is divided into the high-density impurity region and the low density impurity region on the basis of specific impurity density for the sake of convenience.

Similarly, in the GOLD region, as shown in FIG. 8A, in a region immediately below the photoresist 76 through which the impurities with high density can pass, the impurity ions with high density are injected into the polycrystalline semiconductor layer 74, and accordingly, the heavily doped source region 78 and the heavily doped drain region 79 are formed in the polycrystalline semiconductor layer 74. On the other hand, in a region immediately below the photoresist 76 through which the impurities with low density can pass, the impurity ions with low density are injected into the polycrystalline semiconductor layer 74, and accordingly, the lightly doped source region 86 and the lightly doped drain region 87 are formed in the polycrystalline semiconductor layer 74. The channel region 80 is formed immediately below the thickest region of the photoresist 76.

Next, as shown in FIG. 8B, after injecting the impurities into the polycrystalline semiconductor layers 44 and 74, the photoresists 46 and 76 formed on the polycrystalline semiconductor layers 44 and 74 are removed. Next, the gate insulating layer 52 is formed on the entire surface of the substrate 40 including the polycrystalline semiconductor layers 44 and 74, and then, a conductive layer is formed on the gate insulating layer 52. Next, a photoresist is formed on the conductive layer, and then, the photoresist is patterned in a predetermined shape. In patterning the photoresist in the LDD formation region, the photoresist is patterned such that the width of the photoresist becomes equal to the width of the channel region 50 of the polycrystalline semiconductor layer 44. On the other hand, in the GOLD formation region, as shown in FIG. 8B, the photoresist is patterned such that the width of the photoresist becomes equal to the width of the channel region 80 of the polycrystalline semiconductor layer 74 and the width of the lightly doped source region 86 and the lightly doped drain region 87 formed in both ends of the channel region 80 or the photoresist partially overlaps the lightly doped source region 86 and the lightly doped drain region 87. Next, using the photoresists patterned in the predetermined shape as a mask, the conductive layer formed below the photoresist is etched. As a result, in the LDD formation region, the gate electrode 54 is formed, and, in the GOLD formation region, the gate electrode 84 is formed.

In this manner, in the LDD structure region, the channel region 50 is formed immediately below the gate electrode 54 to form the semiconductor device having the LDD structure. On the other hand, in the GOLD structure region, the gate electrode 84 overlaps the channel region 80 and the low density impurity regions 86 and 87 immediately below the gate electrode 84, thereby forming the semiconductor device having the GOLD structure.

As described, by using the taper-shaped photoresist as a mask for the formation of the semiconductor device having the LDD and GOLD structures, the LDD and GOLD structures can be formed on the same substrate with the reduced number of times of photolithography process as compared to the conventional techniques. Therefore, an efficient manufacture process of the semiconductor device can be achieved.

Fifth Embodiment

Next, similar to the fourth embodiment, a method of simultaneously forming a semiconductor device having an LDD structure and a semiconductor device having a GOLD structure on the same substrate will be described with reference to FIGS. 9A and 9B. In these figures, the description of the same processes as the first to fourth embodiments will be omitted or simplified.

FIGS. 9A and 9B are schematic sectional views illustrating a method of manufacturing an n-channel TFT having the LDD structure and the GOLD structure, according to the embodiment of the present invention. In these figures, a TFT region having the LDD structure shown in the right of the figures is an LDD formation region and a TFT region having the GOLD structure shown in the left of the figures is a GOLD formation region.

To begin with, as shown in FIG. 9A, the base protective layer 42 is formed on the entire surface of the substrate 40. Next, an amorphous semiconductor layer is annealed to be changed to the polycrystalline semiconductor layer 44. The photoresist 46 is formed on the polycrystalline semiconductor layer 44. Next, the photoresist 46 is patterned in a predetermined shape. In the LDD formation region, as shown in FIG. 9A, the photoresist 46 is formed to have a shape using halftone exposure in such a manner that a center portion corresponding to the channel region 80 is flat, both sides of the center portion have a taper portion corresponding to a gradient region of the impurity density, and the outermost sides of the center portion have a thin portion corresponding to a high density injection region. Similarly, in the GOLD formation region, the photoresist 76 is formed to have a shape in such a manner that a center portion corresponding to the channel region 80 is flat, both sides of the center portion have a taper portion corresponding to a gradient region of the impurity density, and the outermost sides of the center portion have a thin portion corresponding to a high density injection region.

Next, the polycrystalline semiconductor layers 44 and 74 formed below the photoresists 46 and 76 are respectively etched into a predetermined shape using the photoresists 46 and 76 patterned in the predetermined shape as a mask. In addition, the etching process for the polycrystalline semiconductor layers 44 and 74 is preferably performed after the impurity ions are injected therein.

Next, as shown in FIG. 9A, using each of the photoresists 46 and 76 as a mask, impurity ions (phosphorus ions) with high density are injected at a dose of about $0.1 \times 10^{15}$ to $10 \times 10^{15}/cm^2$, for example, into the polycrystalline semiconductor layer 44 and 74, respectively.

According to such an injection, in the LDD formation region, as the photoresist 46 becomes thick gradually in a direction from the heavily doped source region 48 and the heavily doped drain region 49 of the polycrystalline semiconductor layer 44 to the channel region 50, density of impurities injected into a tape-shaped region of the photoresist 46 becomes low. In this manner, a gradient density region having a gradient density of the impurity is formed. As a result, as shown in FIG. 9A, in a region immediately below the photoresist 46 through which the impurities with high density can pass, the impurity ions with high density are injected into the polycrystalline semiconductor layer 44, and accordingly, the heavily doped source region 48 and the heavily doped drain region 49 are formed in the polycrystalline semiconductor layer 44. On the other hand, in a region immediately below the taper portion of the photoresist 46 through which the impurities with low density can pass, the impurities with low density are injected into the polycrystalline semiconductor layer 44, and accordingly, the lightly doped source region 56 and the lightly doped drain region 57 are formed in the polycrystalline semiconductor layer 44. The channel region 50 is formed immediately below the thickest region of the photoresist 46.

In addition, although the polycrystalline semiconductor layer 44 has the density gradient region formed in the direction from the heavily doped regions of the polycrystalline semiconductor layer 44 to the channel region 50, as described above, for matching with the first to fourth embodiments, it is described in this embodiment that the polycrystalline semiconductor layer is divided into the high density impurity region and the low density impurity region on the basis of specific impurity density for the sake of convenience. Accordingly, the density gradient region immediately below the taper portion of the photoresist 46 in this embodiment is called the low density impurity region for the sake of convenience.

Similarly, in the GOLD region, as shown in FIG. 9A, in a region immediately below the photoresist 76 through which the impurities with high density can pass, the impurities with high density are injected into the polycrystalline semiconductor layer 74, and accordingly, the heavily doped source region 78 and the heavily doped drain region 79 are formed in the polycrystalline semiconductor layer 74. On the other hand, in a region immediately below the taper portion of the photoresist 76 through which the impurities with low density can pass, the impurities with low density are injected into the polycrystalline semiconductor layer 74, and accordingly, the lightly doped source region 86 and the lightly doped drain region 87 are formed in the polycrystalline semiconductor layer 74. In addition, the channel region 80 is formed immediately below the thickest region of the photoresist 76.

Next, as shown in FIG. 9B, after injecting the impurities into the polycrystalline semiconductor layers 44 and 74, the photoresists 46 and 76 formed on the polycrystalline semiconductor layers 44 and 74 are removed. Next, the gate insulating layer 52 is formed on the entire surface of the substrate 40 including the polycrystalline semiconductor layers 44 and 74, and then, a conductive layer is formed on the gate insulating layer 52. Next, a photoresist is formed on the conductive layer, and then, the photoresist is patterned in a predetermined shape. In patterning the photoresist in the LDD formation region, the photoresist is patterned such that the width of the photoresist becomes equal to the width of the channel region 50 of the polycrystalline semiconductor layer 44. On the other hand, in the GOLD formation region, as shown in FIG. 9B, the photoresist is patterned such that the width of the photoresist becomes equal to the width of the channel region 80 of the polycrystalline semiconductor layer 74 and the width of the lightly doped source region 86 and the lightly doped drain region 87 formed in both ends of the channel region 80 or the photoresist partially overlaps the lightly doped source region 86 and the lightly doped drain region 87. Next, using the photoresists patterned in the predetermined shape as a mask, the conductive layer formed below the photoresist is etched. As a result, in the LDD formation region, the gate electrode 54 is formed, and, in the GOLD formation region, the gate electrode 84 is formed.

In this manner, in the LDD structure region, the channel region 50 is formed immediately below the gate electrode 54 to form the semiconductor device having the LDD structure. On the other hand, in the GOLD structure region, the gate electrode 84 overlaps the channel region 80 and the low density impurity regions 86 and 87 immediately below the gate electrode 84, thereby forming the semiconductor device having the GOLD structure.

As described above, by using the taper-shaped mask as a mask for the formation of the semiconductor device having the LDD and GOLD structures, the LDD and GOLD structures can be formed on the same substrate with the reduced number of times of a photolithography process as compared to the conventional techniques. Accordingly, an efficient manufacture process of the semiconductor device can be achieved.

Sixth Embodiment

Next, similar to the third to fifth embodiments, a method of simultaneously forming a semiconductor device having an LDD structure and a semiconductor device having a GOLD structure on the same substrate will be described with reference to FIGS. 10A and 10B. In these figures, the description of the same processes as the first to fifth embodiments will be omitted or simplified.

FIGS. 10A and 10B are schematic sectional views illustrating a method of manufacturing an n-channel TFT having the LDD structure and the GOLD structure, according to the embodiment of the present invention. In these figures, a TFT region having the LDD structure shown in the right of the figures is an LDD formation region and a TFT region having the GOLD structure shown in the left of the figures is a GOLD formation region.

To begin with, as shown in FIG. 10A, the base protective layer 42 is formed on the entire surface of the substrate 40. Next, an amorphous semiconductor layer is annealed to be changed to a polycrystalline semiconductor layer 44, and then, the photoresist 46 is formed on the polycrystalline semiconductor layer 44. Next, the photoresist 46 is patterned in a predetermined shape. In the LDD formation region, as a shape of pattern of the photoresist 46, a region of the photoresist 46 corresponding to the source region 48 and the drain region 49 is thinly formed using the halftone exposure. The film thickness of the region of the photoresist 46 is preferably 50 nm to 200 nm, for example. In addition, a region of the photoresist 46 corresponding to the channel region 50a of the polycrystalline semiconductor layer 44 has a film thickness in such a manner that, when impurity ions with high density are injected into the polycrystalline semiconductor layer 44, the impurity ions are blocked by the photoresist 46. The film thickness of such a region of the photoresist 46 is preferably more than 200 nm, for example. In addition, the channel region 50a is a region corresponding to the lightly doped source region 56, the lightly doped drain region 57, and the channel region 50, which will be described later.

On the other hand, in the GOLD formation region, the photoresist 76 is formed to have a taper shape having a predetermined inclined angle using the halftone exposure in such a manner that the photoresist 76 becomes thick in the direction from the end of the polycrystalline semiconductor layer 74 to the channel region 80.

Next, the polycrystalline semiconductor layers 44 and 74 formed below the photoresists 46 and 76 are respectively etched into a predetermined shape using the photoresists 46 and 76 patterned in the predetermined shape as a mask. In addition, the etching process for the polycrystalline semiconductor layers 44 and 74 is preferably performed after the impurity ions are injected therein.

Next, as shown in FIG. 10A, using each of the photoresists 46 and 76 as a mask, impurity ions (phosphorus ions) with high density are injected at a dose of about $0.1 \times 10^{15}$ to $10 \times 10^{15}/cm^2$, for example, into the polycrystalline semiconductor layer 44 and 74. In the LDD region, the impurities with high density are injected into a thin portion of the photoresist 46. In this manner, the heavily doped source region 48 and the heavily doped drain region 49 are formed in the polycrystalline semiconductor layer 44 in a self-alignment manner using the photoresist 46 as the mask. In addition, in a region of the polycrystalline semiconductor layer 44 immediately below the photoresist 46, since the impurities ions are blocked by using the photoresist 46 as a mask, the channel region 50a is formed without injection of the impurities ions into the polycrystalline semiconductor layer 44.

On the other hand, in the GOLD formation region, since the photoresist 76 has the taper shape, it has a density gradient in which density of injected impurities becomes low as the photoresist 76 becomes thick gradually in the direction from the heavily doped source region 78 and the heavily doped drain region 79 of both ends of the polycrystalline semiconductor layer 74 to the channel region 80. In this manner, as shown in FIG. 10A, in a region immediately below the photoresist 76 through which the impurities with high density can pass, the impurities with high density are injected into the polycrystalline semiconductor layer 74, and accordingly, the source regions 78 and 79 are formed in a self-alignment in the polycrystalline semiconductor layer 74. On the other hand, in a region immediately below the photoresist 76 through which the impurities with low density can pass, the impurities with low density are injected into the polycrystalline semiconductor layer 74, and accordingly, the lightly doped source region 86 and the lightly doped drain region 87 are formed in the polycrystalline semiconductor layer 74. The channel region 80 is formed immediately below the thickest region of the photoresist 76.

Next, as shown in FIG. 10B, after injecting the impurities into the polycrystalline semiconductor layers 44 and 74, the photoresists 46 and 76 formed on the polycrystalline semiconductor layers 44 and 74 are removed. Next, the gate insulating layer 52 is formed on the entire surface of the substrate 40 including the polycrystalline semiconductor layers 44 and 74, and then, a conductive layer is formed on the gate insulating layer 52. Next, a photoresist is formed on the conductive layer, and then, the photoresist is patterned in a predetermined shape. In the LDD formation region, the photoresist (not shown) is narrower than the channel region 50a formed below the photoresist in FIG. 10A and is aligned such that the lightly doped source and drain regions 56 and 57 are formed on both ends of the channel region 50a.

On the other hand, in the GOLD formation region, the photoresist (not shown) is formed to have the same width as the channel region 80 of the polycrystalline semiconductor layer 74 and the lightly doped source region 86 and the lightly doped drain region 87. In this case, the photoresist may partially overlaps the lightly doped source region 86 and the lightly doped drain region 87. Next, using the photoresist patterned in the predetermined shape as a mask, the conductive layer formed below the photoresist is etched. In this manner, in the LDD structure region, the gate electrode 54 is formed, and, in the GOLD structure region, the gate electrode 84 is formed.

Next, in the LDD formation region, using the gate electrode 54 as a mask, impurity ions (phosphorus ions) with low density are injected at a dose of about $0.1 \times 10^{13}$ to $10 \times 10^{13}/cm^2$, for example. In this manner, the lightly doped source region 56 and the lightly doped drain region 57 are formed in a self-alignment manner in both ends of the channel region 50 of the polycrystalline semiconductor layer 44.

As described above, in the LDD structure region, the channel region 50 is formed immediately below the gate electrode 54 to form the semiconductor device having the LDD structure. On the other hand, in the GOLD structure region, the gate electrode 84 overlaps the channel region 80 and the low density impurity regions 86 and 87 immediately below the gate electrode 84, thereby forming the semiconductor device having the GOLD structure.

According to this embodiment, for the formation of the semiconductor device having the LDD structure, a thin photoresist corresponding to the source region and the drain region is used as a mask, and, for the formation of the semiconductor device having the GOLD structure, a taper-shaped mask is used as a mask. Accordingly, it is possible to form the semiconductor device having the LDD and GOLD structures on the same substrate with the reduced number of times of a photolithography process as compared to the conventional techniques. Accordingly, an efficient manufacture process of the semiconductor device can be achieved.

Seventh Embodiment

Next, a seventh embodiment of the present invention will be described with reference to the accompanying drawings.

Figure 11:
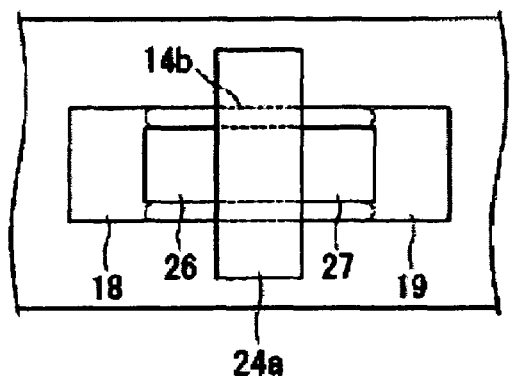
FIG. 11 is a plan view of a general configuration of a semiconductor device according to a seventh embodiment of the present invention.

In this embodiment, a photoresist is processed such that impurity ions penetrate a thin region of the photoresist to form an impurity region in a polycrystalline semiconductor layer and the impurity ions are blocked by a thick region of the photoresist to form a non-impurity region in the polycrystalline semiconductor layer. In this case, by forming a side of the thick region of the photoresist vertically with respect to a substrate, a boundary is made between an impurity penetration region and an impurity shielding region. However, a side of the photoresist may have an inclined plane of a taper shape due to a problem related to precision of an exposure system. Accordingly, since the inclined plane of the taper shape becomes thin gradually, impurities may be injected into a region 14b (a region surrounded by a dot chain line) immediately below the inclined plane of the photoresist, into which the impurities are not originally injected, as shown in FIG. 11. As a result, the source regions 18 and 26 and the drain regions 19 and 27, which are formed in both sides of the channel region, respectively, are interconnected by the impurity region 14b formed in the periphery of the channel region, and accordingly, a pass of electrons from the source regions 18 and 26 to the drain regions 19 and 27 is formed. Accordingly, irrespective of on/off of the gate electrode 24a, electrons leak from the source regions 18 and 26 to the drain regions 19 and 27, which may result in incorrect switching of the TFT. Accordingly, this embodiment overcomes this problem by removing the impurity region using an over-etching process.

In addition, since the manufacturing method of the semiconductor device having the LDD structure has the same basic configuration as the first embodiment, the same elements as the first embodiment are denoted by the same reference numerals, and detailed explanation thereof will be omitted.

FIGS. 12 to 15 are diagrams illustrating a manufacturing process of an n-channel TFT having an LDD structure according to the seventh embodiment. In these figures, FIGS. 12A to 15A are a plan view of the manufacturing process and FIGS. 12B to 15B are sectional views taken along the line B-B' in the diagrams shown in FIGS. 12A to 15A.

Figure 12A:
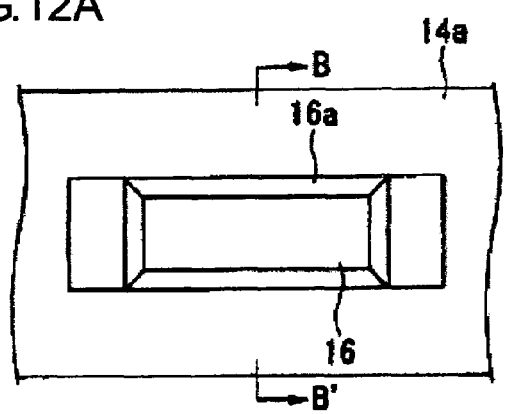
FIGS. 12A and 12B are diagrams illustrating a method of manufacturing the semiconductor device according to the seventh embodiment.
Figure 12B:
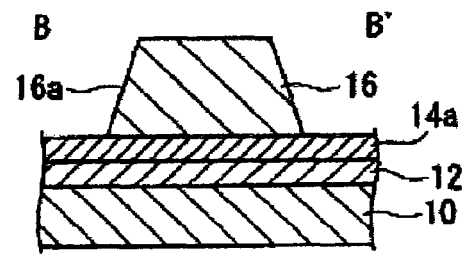

As shown in FIG. 12B, first, a base protective layer 12 made of a silicon oxide is formed on the entire surface of a glass substrate 10 using a plasma CVD method. Next, an amorphous semiconductor layer is formed on the entire surface of the base protective layer 12 using the plasma CVD method, and then, the amorphous semiconductor layer is polycrystallized by performing a laser annealing process to form a polycrystalline semiconductor layer 14a on the base protective layer 12.

Next, similar to the first embodiment, a photoresist 16 is formed on the polycrystalline semiconductor layer 14a, and then, the photoresist 16 is patterned in a predetermined shape by a photolithography process. The photoresist 16 is formed to have a thin region through which the impurity ions pass and a thick region by which the impurity ions are blocked, as described above. In this case, a side of the thick region of the photoresist 16 is preferably formed at an angle of 90 degrees with respect to the glass substrate 10 in order to prevent the impurity ions from being injected into the thick region. However, as shown in FIG. 12B, the side of the photoresist 16 may have an inclined plane 16a of a taper shape with an angle of 80 degrees, for example, with respect to the glass substrate 10, due to a problem related to precision of an exposure system. In addition, in this embodiment, the thick region of the photoresist 16 includes a region of the inclined plane 16a of the taper shape.

Figure 13A:
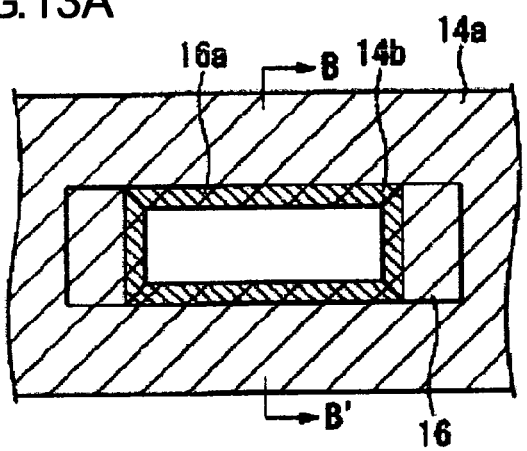
FIGS. 13A and 13B are diagrams illustrating a method of manufacturing the semiconductor device according to the seventh embodiment.
Figure 13B:
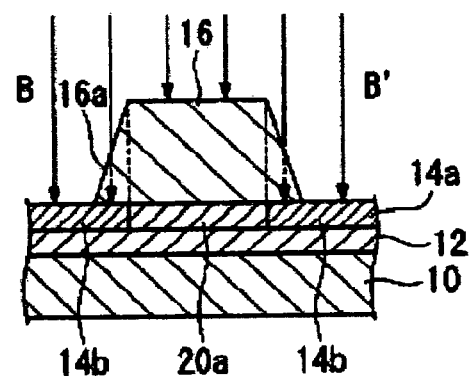

Next, as shown in FIGS. 13A and 13B, using the photoresist patterned in the predetermined shape as a mask, impurity ions with high density are injected into the polycrystalline semiconductor layer 14a. Accordingly, the impurity ions with high density pass through the thin region of the photoresist 16 and are injected into the polycrystalline semiconductor layer 14a. On the other hand, the impurity ions with high density are blocked by the thick region of the photoresist 16. Here, as shown in FIG. 13B, since the photoresist 16 becomes thin gradually, the impurity ions with high density pass through the inclined plane 16a of the taper shape at the side of the photoresist 16 and are injected into the polycrystalline semiconductor layer 14a. In FIG. 13A, a slashed portion is a region into which the impurity ions with high density are injected, and a netted portion is the region 14b into which the impurity ions with high density are not originally injected. Then, in this embodiment, as shown in FIGS. 13A and 13B, the impurity ions are injected into the region 14b immediately below the inclined plane 16a of the photoresist 16 having the taper shape in addition to a region immediately below the thin region of the photoresist 16.

Figure 14A:
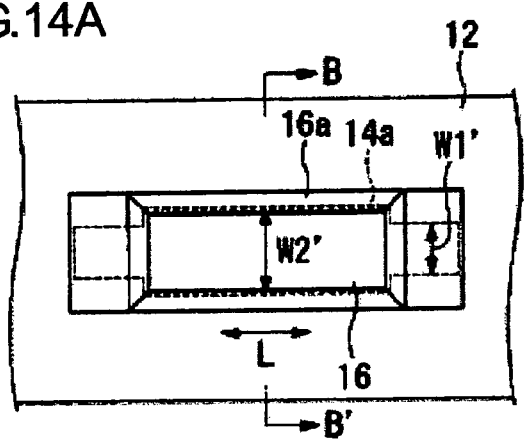
FIGS. 14A and 14B are diagrams illustrating a method of manufacturing the semiconductor device according to the seventh embodiment.
Figure 14B:
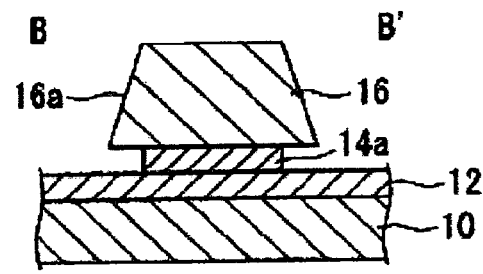

Next, as shown in FIGS. 14A and 14B, using the photoresist 16 patterned in the predetermined shape as a mask, the polycrystalline semiconductor layer 14a is etched. Various etching methods including dry etching (RIE) and wet etching may be used for this etching process. First, using the etching process, the polycrystalline semiconductor layer 14a existing in a region except the region immediately below the photoresist 16 (a region not coated with the photoresist 16) is removed. In addition, in this embodiment, since the impurity ions are injected into the region 14b immediately below the inclined plane 16a of the taper shape of the photoresist 16, the impurity region 14b is removed by the etching process. In this manner, by over-etching a region except the region immediately below the photoresist 16, as shown in FIG. 14B, the impurity ions with high density in the region 14b (indicated by a broken line in FIG. 14A) immediately below the inclined plane 16a of the taper shape of the photoresist 16 are removed. In the over-etching, the region immediately below the thin region of the photoresist 16 is more etched than the region immediately below the thick region of the photoresist 16. In FIG. 14A, the line with W1' of the polycrystalline semiconductor layer 14a in the region immediately below the thin region of the photoresist 16 is smaller than the line with W2' of the polycrystalline semiconductor layer 14a in the region immediately below the thick region of the photoresist 16. In addition, after the over-etching process, by controlling an etching speed, it is possible to stop the over-etching at a point when the line with W1' of the polycrystalline semiconductor layer 14a in the region immediately below the thin region of the photoresist 16 becomes equal to the line width W2' of the polycrystalline semiconductor layer 14a in the region immediately below the thick region of the photoresist 16. As described above, in this embodiment, in the region 14b immediately below the inclined plane 16a of the taper shape of the photoresist 16 (i.e., the region immediately below the thick region of the photoresist), the impurity region of the polycrystalline semiconductor layer 14a extending in parallel to a channel length L of the channel region is removed by the etching process.

Figure 15A:
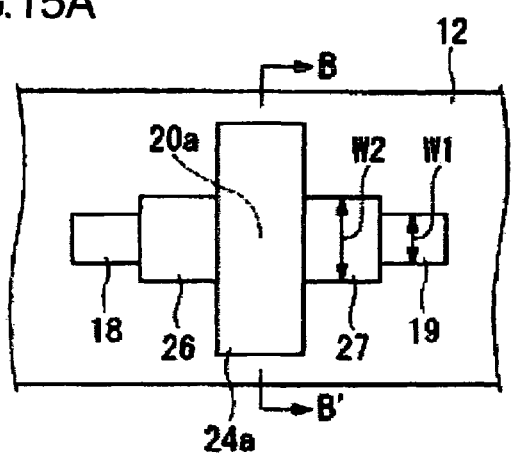
FIGS. 15A and 15B are diagrams illustrating a method of manufacturing the semiconductor device according to the seventh embodiment.
Figure 15B:
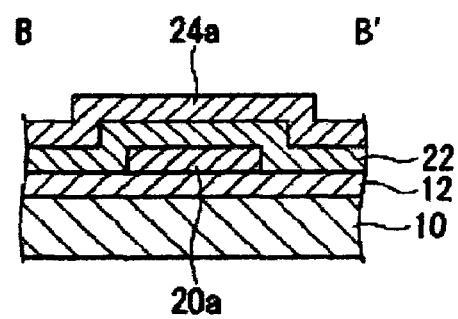

Next, as shown in FIGS. 15A and 15B, the photoresist 16 on the polycrystalline semiconductor layer 14a is removed, and then, the gate insulating layer 22 is formed on the entire surface of the glass substrate 10 including the polycrystalline semiconductor layer 14a using a plasma CVD method, a sputtering method or the like. Subsequently, the gate electrode 24a, which is patterned in a predetermined shape, is formed on the gate insulating layer 22.

Next, using the gate electrode 24a as a mask, impurity ions with low density are injected. Accordingly, as shown in FIG. 15A, the lightly doped source region 26 and the lightly doped drain region 27 are formed in the polycrystalline semiconductor layer 14a except the region immediately below the gate electrode 24a, and the channel region 20a is formed in the region immediately below the gate electrode 24a. In addition, the region immediately below the thin region of the photoresist 16 corresponds to the heavily doped source region 18 and the heavily doped drain region 19, and the region immediately below the thick region of the photoresist 16 corresponds to the lightly doped source region 26 and the lightly doped drain region 27.

At this time, as shown in FIG. 15A, when the semiconductor device is viewed in plane, the line width W1 of the heavily doped source region 18 and the heavily doped drain region 19 is smaller than the line width W2 of the lightly doped source region 26 and the lightly doped drain region 27. That is, the line width W1 of the heavily doped source region 18 and the heavily doped drain region 19 may be less than the line width W2 of the lightly doped source region 26 and the lightly doped drain region 27.

According to this embodiment, in the region immediately below the inclined plane of the taper shape of the photoresist, the impurity region extending in parallel to the channel length L of the channel region can be removed by the over-etching process. Accordingly, by removing the impurity region, which is a pass of electrons, it can be prevented electrons from leaking from the source region to the drain region. Accordingly, correct switching of the TFT is possible by switching on/off of the gate electrode.

Modification of Seventh Embodiment

Next, a modification of the seventh embodiment will be described with reference to the accompanying drawings.

Except that this modification provides the semiconductor device having the GOLD structure unlike the seventh embodiment providing the semiconductor device having the LDD structure, the method of manufacturing the semiconductor device has the same basic configuration as the seventh embodiment. Therefore, the same elements as the first embodiment are denoted by the same reference numerals, and detailed explanation thereof will be omitted.

FIGS. 16 to 19 are diagrams illustrating a manufacturing process of an n-channel TFT having an GOLD structure according to the present embodiment. In these FIGS. 16 to 19, FIGS. 16A to 19A are plan views of the manufacturing process and FIGS. 16B to 19B are sectional views taken along the line C-C' in the diagrams shown in FIGS. 16A to 19A.

Figure 16A:
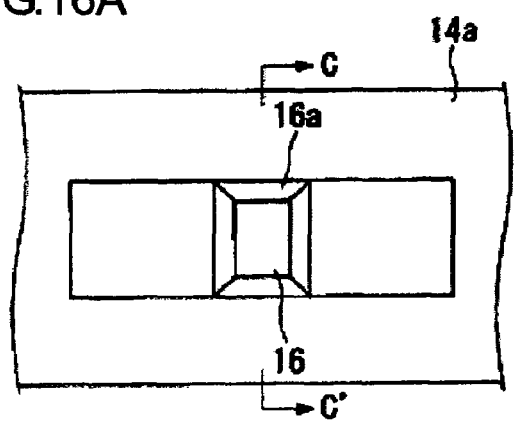
FIGS. 16A and 16B are diagrams illustrating a method of manufacturing a semiconductor device according to a modification of the seventh embodiment.
Figure 16B:
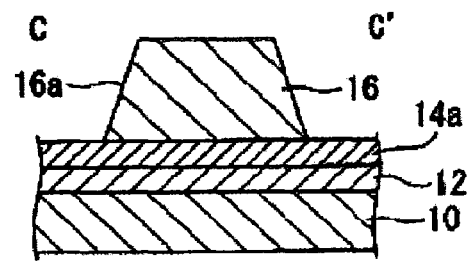

As shown in FIG. 16B, first, the base protective layer 12 is formed on the entire surface of the glass substrate 10, and then, the polycrystalline semiconductor layer 14a is formed on the base protective layer 12. Next, the photoresist 16 is formed on the polycrystalline semiconductor layer 14a, and then, the photoresist 16 is patterned in a predetermined shape. The photoresist 16 is formed to have a thin region through which the impurity ions pass and a thick region by which the impurity ions are blocked, as described above. In this case, a side of the thick region of the photoresist 16 may have the inclined plane 16a of the taper shape with an angle of 80 degrees, for example, with respect to the glass substrate 10, due to a problem related to precision of an exposure system, as shown in FIG. 16B.

Figure 17A:
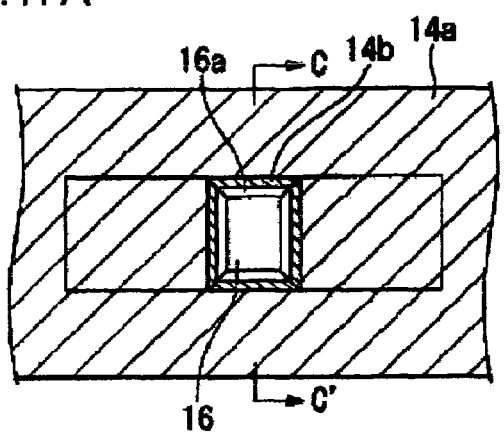
FIGS. 17A and 17B are diagrams illustrating a method of manufacturing a semiconductor device according to a modification of the seventh embodiment.
Figure 17B:
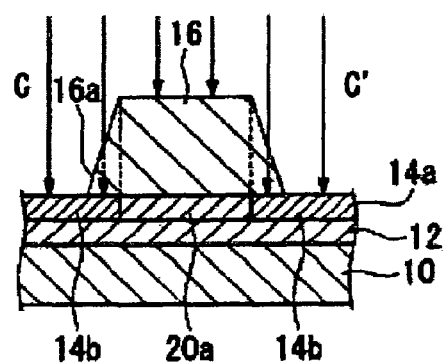

Next, as shown in FIGS. 17A and 17B, using the photoresist patterned in the predetermined shape as a mask, impurity ions with low density are injected into the polycrystalline semiconductor layer 14a. As such, in the thin region of the photoresist 16, the impurity ions with low density are injected into the polycrystalline semiconductor layer 14a, and, the impurity ions with low density are blocked by the thick region of the photoresist 16. Here, as shown in FIG. 17B, since the photoresist 16 becomes thin gradually, the impurity ions with low density pass through the inclined plane 16a of the taper shape at the side of the photoresist 16 and are injected into the polycrystalline semiconductor layer 14a. In FIG. 17A, a slashed portion is a region into which the impurity ions with low density are injected, and a netted portion is the region 14b into which the impurity ions with low density are not originally injected. Then, in this modification, as shown in FIGS. 17A and 17B, the impurity ions are injected into the region 14b immediately below the inclined plane 16a of the taper shape of the photoresist 16 in addition to a region immediately below the thin region of the photoresist 16.

Figure 18A:
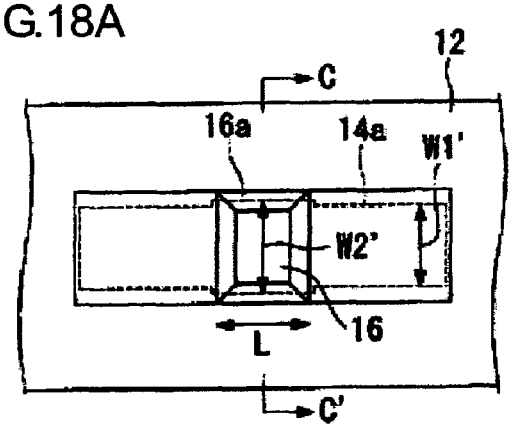
FIGS. 18A and 18B are diagrams illustrating a method of manufacturing a semiconductor device according to a modification of the seventh embodiment.
Figure 18B:
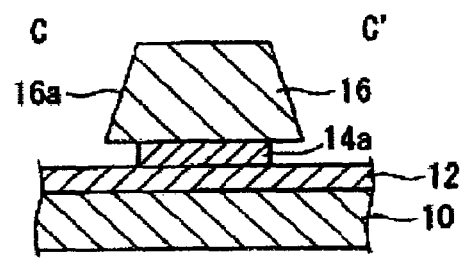

Next, as shown in FIGS. 18A and 18B, using the photoresist 16 patterned in the predetermined shape as a mask, the polycrystalline semiconductor layer 14a is etched. First, using the etching process, the polycrystalline semiconductor layer 14a existing in a region except the region immediately below the photoresist 16 is removed. In addition, in this modification, since the impurity ions with low density are injected into the region 14b immediately below the inclined plane 16a of the taper shape of the photoresist 16, the impurity region 14b is removed by the etching process. In this manner, in this modification, by over-etching a region except the region immediately below the photoresist 16, as shown in FIG. 18B, the impurity ions with low density in the region 14b (indicated by a broken line in FIG. 18A) immediately below the inclined plane 16a of the taper shape of the photoresist 16 are removed. After the over-etching, the region immediately below the thin region of the photoresist 16 is more etched than the region immediately below the thick region of the photoresist 16. In FIG. 18A, the line with W1' of the polycrystalline semiconductor layer 14a in the region immediately below the thin region of the photoresist 16 is smaller than the line with W2' of the polycrystalline semiconductor layer 14a in the region immediately below the thick region of the photoresist 16. As described above, in this modification, in the region 14b immediately below the inclined plane 16a of the taper shape of the photoresist 16 (the region immediately below the thick region of the photoresist), the impurity region of the polycrystalline semiconductor layer 14a extending in parallel to a channel length L of the channel region is removed by the etching process.

Figure 19A:
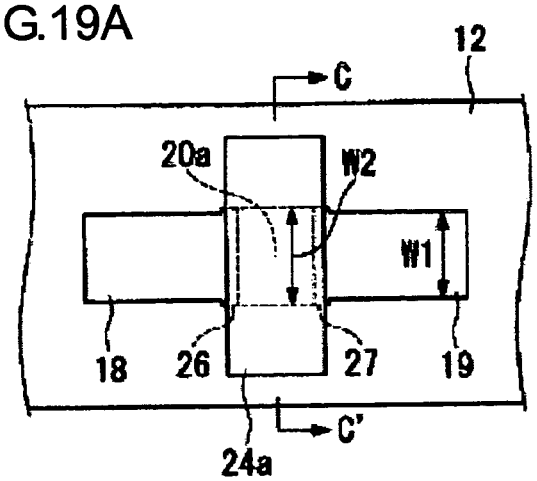
FIGS. 19A and 19B are diagrams illustrating a method of manufacturing a semiconductor device according to a modification of the seventh embodiment.
Figure 19B:
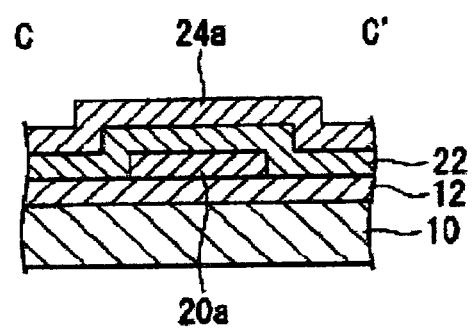

Next, the photoresist 16 formed on the polycrystalline semiconductor layer 14a is removed. Next, as shown in FIGS. 19A and 19B, the gate insulating layer 22 is formed on the entire surface of the glass substrate 10 including the polycrystalline semiconductor layer 14a using a plasma CVD method, a sputtering method or the like. Subsequently, the gate electrode 24a is formed on the gate insulating layer 22. At this time, the gate electrode 24a is formed such that both ends of the gate electrode 24a overlap the region including the impurity with low density injected into the polycrystalline semiconductor layer 14a.

Next, using the gate electrode 24a as a mask, impurity ions with high density are injected into the polycrystalline semiconductor layer 14a. Accordingly, as shown in FIG. 19A, the impurity ions with high density are injected into a region of the polycrystalline semiconductor layer 14a, which is not coated with the gate electrode 24a, to thereby form the heavily doped source region 18 and the heavily doped drain region 19. On the other hand, the channel region 20 and the lightly doped source region 26 and the lightly doped drain region 27 at both ends of the channel region 20 are formed in a region of the polycrystalline semiconductor layer 14a, which is coated with the gate electrode 24a and positioned immediately below the gate electrode 24a. At this time, as shown in FIG. 19A, when the semiconductor device is viewed in plane, the line width W1 of the heavily doped source region 18 and the heavily doped drain region 19 is smaller than the line width W2 of the lightly doped source region 26 and the lightly doped drain region 27.

This modification has the same operation and effect as the seventh embodiment. That is, in the region immediately below the inclined plane of the taper shape of the photoresist, the low density impurity region extending in parallel to the channel length L of the channel region can be removed by the over-etching process. Accordingly, as the impurity region, which is a pass of electrons, is removed, it can be prevented electrons from leaking from the source region to the drain region. Accordingly, correct switching of the TFT is possible by switching on/off of the gate electrode.

Electronic Apparatus

Hereinafter, an example of an electronic apparatus having the liquid crystal display device according to the above embodiments and modification will be described.

Figure 20:
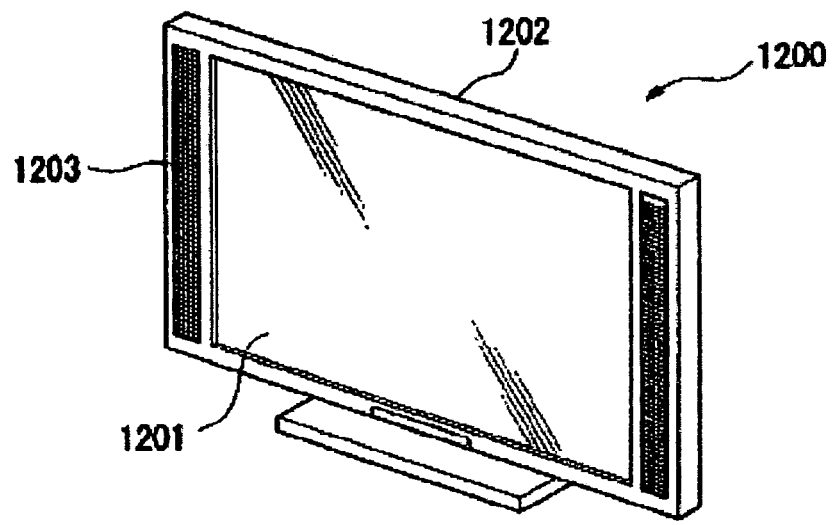
FIG. 20 is a perspective view illustrating an example of an electronic apparatus according to the present invention.

FIG. 20 is a perspective view of an example of a liquid crystal display television 1200. In FIG. 20, a reference numeral 1202 denotes a television main body, a reference numeral 1203 denotes a speaker, and a reference numeral 1201 denotes a display unit employing the liquid crystal display device. Further, the above-described liquid crystal display device 1 is applicable to various electronic apparatuses other than the liquid crystal display television, including, for example, projectors, personal computers (PCs) and engineering workstations (EWS) for multimedia, pagers, word processors, view-finder-type or monitor-direct-view-type video tape recorders, electronic notes, electronic calculators, car navigators, POS terminals, apparatuses equipped with touch panels, etc.

The scope of the present invention is not limited to the above-described embodiments and includes various modifications to the embodiments without deviating from the spirit of the present invention.

For example, although it has been described in the above embodiments that the impurity ions are injected into the polycrystalline semiconductor layer using the photoresist where a film thickness of a specific region is thinner than that of another region as a mask, it may be preferable to expose a region of the polycrystalline semiconductor layer corresponding to the specific thin region by re-exposing (by using halftone exposure or the like) the specific thin region of the photoresist and then inject the impurities into the polycrystalline semiconductor layer directly after removing the thin phtoresist. This allows uniform injection of the impurities into the polycrystalline semiconductor layer. In this case, since the impurities are directly injected into the polycrystalline semiconductor layer, it is preferable that the impurities are injected with an acceleration voltage or the like of an impurity ion injection apparatus set to be low as compared in the above embodiments.

Further, although the present invention has been described in detail in connection with the liquid crystal display device, for the semiconductor device provided at the side of the substrate 10, the present invention is applicable to light-emitting-type organic EL display devices, line heads and recording apparatuses having organic EL devices as sources of light, etc.

What is claimed is:

1. A method of manufacturing a semiconductor device including a semiconductor layer having a heavily doped source region, a heavily doped drain region, a lightly doped source region, a lightly doped drain region, and a channel region, and a gate electrode opposite to the semiconductor layer with an insulating layer interposed therebetween, the method comprising:

forming a semiconductor film on a substrate;

forming a resist on the semiconductor film such that a first portion of the resist corresponding to the heavily doped source region and the heavily doped drain region is thinner than a second portion of the resist corresponding to the lightly doped source region, the lightly doped drain region, and the channel region;

forming the heavily doped source region and the heavily doped drain region by etching the semiconductor film in a predetermined pattern using the resist as a mask and injecting high-density impurities into the semiconductor film through the first portion of the resist;

removing the resist from the semiconductor film to form a gate insulating layer on the semiconductor film;

forming the gate electrode at a position on the gate insulating layer which corresponds to the channel region; and forming the lightly doped source region and the lightly doped drain region by injecting impurities having a density lower than the density of the high density impurities into the semiconductor film using the gate electrode as a mask.

2. The method of manufacturing a semiconductor device according to claim 1, wherein during the forming of the resist, the first portion of the resist corresponding to the heavily doped source region and the heavily doped drain region is formed so as to be thinner than the second portion of the resist corresponding to the lightly doped source region, the lightly doped drain region, and the channel region by using a photomask having locally different transmittance when the resist is exposed.

3. The method of manufacturing a semiconductor device according to claim 1, wherein during the forming of the resist, the first portion of the resist corresponding to the heavily doped source region and the heavily doped drain region is formed to have a film thickness of 50 nm to 200 nm.

4. A semiconductor device manufactured by the method of manufacturing a semiconductor device according to claim 1, comprising:

the heavily doped source region and the heavily doped drain region which are formed to have the same width from an end portion of the semiconductor film, and the heavily doped source region and the heavily doped drain region of the semiconductor film which are formed to be thinner than the lightly doped source region, the lightly doped drain region, and the channel region.

5. A method of manufacturing a semiconductor device including a semiconductor layer having a heavily doped source region, a heavily doped drain region, a lightly doped source region, a lightly doped drain region, and a channel region, and a gate electrode opposite to the semiconductor layer with an insulating layer interposed therebetween, the method comprising:

forming a semiconductor film on a substrate;

forming a resist on the semiconductor film such that a first portion of the resist corresponding to the heavily doped source region and the heavily doped drain region is thinner than a second portion of the resist corresponding to the lightly doped source region, the lightly doped drain region, and the channel region;

forming the heavily doped source region and the heavily doped drain region by injecting high density impurities into the semiconductor film through the first portion of the resist;

etching the semiconductor film in a predetermined pattern using the resist as a mask;

removing the resist from the semiconductor film to form a gate insulating layer on the semiconductor film;

forming the gate electrode at a position on the gate insulating layer which corresponds to the channel region; and forming the lightly doped source region and the lightly doped drain region by injecting impurities having a density lower than the density of the high density impurities into the semiconductor film using the gate electrode as a mask, wherein during the etching of the semiconductor film, from an impurity region of the semiconductor film below the second portion of the resist, the high density impurities being injected into the impurity region, the semiconductor film of an impurity region extending in parallel to a channel length of the channel region is removed.

6. A semiconductor device manufactured by the method of manufacturing a semiconductor device according to claim 5, comprising:

the heavily doped source region and the heavily doped drain region which are formed to be narrower than the lightly doped source region and the lightly doped drain region.

7. A method of manufacturing a semiconductor device including a semiconductor layer having a heavily doped source region, a heavily doped drain region, a lightly doped source region, a lightly doped drain region, and a channel region, and a gate electrode opposite to the semiconductor layer with an insulating layer interposed therebetween, the method comprising:

forming a semiconductor film on a substrate;

forming a resist on the semiconductor film such that a first portion of the resist corresponding to the heavily doped source region, the heavily doped drain region, the lightly doped source region and the lightly doped drain region is thinner than a second portion of the resist corresponding to the channel region;

forming the lightly doped source region and the lightly doped drain region by etching the semiconductor film in a predetermined pattern using the resist as a mask and injecting low density impurities into the semiconductor film through the first portion of the resist;

removing the resist from the semiconductor film to form a gate insulating layer on the semiconductor film;

forming the gate electrode at a position on the gate insulating layer which corresponds to the lightly doped source region, the lightly doped drain region, and the channel region; and forming the heavily doped source region and the heavily doped drain region by injecting impurities having a density higher than the density of the low density impurities into the semiconductor film using the gate electrode as a mask.

8. The method of manufacturing a semiconductor device according to claim 7, wherein during the forming of the resist, the first portion of the resist corresponding to the lightly doped source region and the lightly doped drain region is formed so as to be thinner than the second portion of the resist corresponding to the channel region by using a photomask having locally different transmittance when the resist is exposed.

9. The method of manufacturing a semiconductor device according to claim 7, wherein during the forming of the resist, the first portion of the resist corresponding to the lightly doped source region and the lightly doped drain region is formed to have a film thickness of 50 nm to 200 nm.

10. A method of manufacturing a semiconductor device including a semiconductor layer having a heavily doped source region, a heavily doped drain region, a lightly doped source region, a lightly doped drain region, and a channel region, and a gate electrode opposite to the semiconductor layer with an insulating layer interposed therebetween, the method comprising:

forming a semiconductor film on a substrate;

forming a resist on the semiconductor film such that a first portion of the resist corresponding to the heavily doped source region, the heavily doped drain region, the lightly doped source region and the lightly doped drain region is thinner than a second portion of the resist corresponding to the channel region;

forming the lightly doped source region and the lightly doped drain region by injecting low density impurities into the semiconductor film through the first portion of the resist;

etching the semiconductor film in a predetermined pattern using the resist as a mask;

removing the resist from the semiconductor film to form a gate insulating layer on the semiconductor film;

forming the gate electrode at a position on the gate insulating layer which corresponds to the lightly doped source region, the lightly doped drain region, and the channel region; and forming the heavily doped source region and the heavily doped drain region by injecting impurities having a density higher than the density of the low density impurities into the semiconductor film using the gate electrode as a mask, wherein during the etching the semiconductor film, from an impurity region of the semiconductor film below the second portion of the resist, the low-density impurities being injected into the impurity region, the semiconductor film of an impurity region extending in parallel to a channel length of the channel region is removed.

11. A semiconductor device manufactured by the method of manufacturing a semiconductor device according to claim 10, comprising:

the heavily doped source region and the heavily doped drain region which are formed to be narrower than the lightly doped source region and the lightly doped drain region.

12. A method of manufacturing a semiconductor device including a semiconductor layer having a heavily doped source region, a heavily doped drain region, a lightly doped source region, a lightly doped drain region, and a channel region, and a gate electrode opposite to the semiconductor layer with an insulating layer interposed therebetween, the method comprising:

forming a semiconductor film on a substrate;

forming a resist on the semiconductor film such that a center portion of the resist is a flat portion and both ends of the resist is a tapered portion;

forming a density gradient region and the channel region in the semiconductor film by injecting high density impurities into the semiconductor film through the tapered portion of the resist;

etching the semiconductor film in a predetermined pattern using the resist as a mask;

removing the resist from the semiconductor film to form a gate insulating layer on the semiconductor film; and forming the gate electrode at a position on the gate insulating layer which corresponds to the channel region or a portion of the channel region and the density gradient region.

13. The method of manufacturing a semiconductor device according to claim 12, wherein a semiconductor device having the gate electrode formed at a position on the gate insulating layer which corresponds to the channel region and a semiconductor device having the gate electrode formed at a position on the gate insulating layer which corresponds to a portion of the channel region and the density gradient region are formed on the same substrate.

14. The method of manufacturing a semiconductor device according to claim 12, wherein a semiconductor device formed using the resist, a center portion of the resist being a flat portion and both ends of the resist being a tapered portion, and a semiconductor device formed using the resist having a thin region of the resist into which impurities are injected are formed on the same substrate.

15. A method of manufacturing a semiconductor device including a semiconductor layer having a heavily doped source region, a heavily doped drain region, a lightly doped source region, a lightly doped drain region, and a channel region, and a gate electrode opposite to the semiconductor layer with an insulating layer interposed therebetween, the method comprising:

forming a semiconductor film on a substrate;

forming a resist on the semiconductor film such that a center portion of the resist is a flat portion, ends of the resist are thinner than the flat portion, and a portion between the flat portion and the thin ends has a tapered shape;

etching the semiconductor film in a predetermined pattern using the resist as a mask;

forming the channel region, the heavily doped region, and the density gradient region on the semiconductor film by injecting high-density impurities into the semiconductor film through the resist;

removing the resist from the semiconductor film to form a gate insulating layer on the semiconductor film; and forming the gate electrode at a position on the gate insulating layer which corresponds to the channel region or a portion of the channel region and the density gradient region.

16. The method of manufacturing a semiconductor device according to claim 15, wherein a semiconductor device having the gate electrode formed at a position on the gate insulating layer which corresponds to the channel region and a semiconductor device having the gate electrode formed at a position on the gate insulating layer which corresponds to a portion of the channel region and the density gradient region are formed on the same substrate.

17. The method of manufacturing a semiconductor device according to claim 15, wherein a semiconductor device formed using the resist formed such that a center portion of the resist to be the channel region is a flat portion, ends of the resist to be a heavily doped region are thinner than the flat portion, and a portion to be a density gradient region between the flat portion and the thin ends has a tapered shape and a semiconductor device formed using the resist having a thin region of the resist into which impurities are injected are formed on the same substrate.

18. A method of manufacturing a semiconductor device including a semiconductor layer having a heavily doped source region, a heavily doped drain region, a lightly doped source region, a lightly doped drain region and a channel region, and a gate electrode opposite to the semiconductor layer with an insulating layer interposed therebetween, the method comprising:

forming a semiconductor film on a substrate;

in a first semiconductor device formation region, forming a resist on the semiconductor film such that a first portion of the resist corresponding to the heavily doped source region and the heavily doped drain region is thinner than a second portion of the resist corresponding to the channel region, the lightly doped source region, and the lightly doped drain region;

in a second semiconductor device formation region, forming a resist on the semiconductor film such that a third portion of the resist corresponding to the heavily doped source region, the heavily doped drain region, the lightly doped source region and the lightly doped drain region is thinner than a fourth portion of the resist corresponding to the channel region and is thicker than the first portion of the resist corresponding to the heavily doped source region and the heavily doped drain region in the first semiconductor device formation region;

forming the heavily doped source region and the heavily doped drain region in the first semiconductor device formation region and forming the lightly doped source region, the lightly doped drain region and the channel region in the second semiconductor device formation region, by etching the semiconductor film in each of the first and second semiconductor device formation regions using the resists as masks and injecting high density impurities into the semiconductor film;

removing the resist formed in each of the first and second semiconductor device formation regions from the semiconductor film to form a gate insulating layer on the semiconductor film;

in the first semiconductor device formation region, forming the gate electrode at a position on the gate insulating layer which corresponds to the channel region;

in the second semiconductor device formation region, forming the gate electrode at a position on the gate insulating layer which corresponds to the channel region, the lightly doped source region and the lightly doped drain region;

forming the lightly doped source region and the lightly doped drain region in the first semiconductor device formation region by injecting impurities having a density lower than the density of the high density impurities into the semiconductor film using the gate electrode in each of the first and second semiconductor device formation regions as a mask; and coating the entire surface of the first semiconductor device formation region with a resist and forming the heavily doped source region and the heavily doped drain region in the second semiconductor device formation region by injecting the high-density impurities into the semiconductor film of the second semiconductor device formation region.

19. A method of manufacturing a semiconductor device including a semiconductor layer having a heavily doped source region, a heavily doped drain region, a lightly doped source region, a lightly doped drain region, and a channel region, and a gate electrode opposite to the semiconductor layer with an insulating layer interposed therebetween, the method comprising:

forming a semiconductor film on a substrate;

forming a resist on the semiconductor film such that a first portion of the resist corresponding to the source region and the drain region is thinner than a second portion of the resist corresponding to the channel region;

forming the source region and the drain region by etching the semiconductor film in a predetermined pattern using the resist as a mask and injecting impurities into the semiconductor film through the resist;

removing the resist from the semiconductor film to form a gate insulating layer on the semiconductor film; and forming the gate electrode at a position on the gate insulating layer.

20. A semiconductor device manufactured by the method of manufacturing a semiconductor device according to claim 19.

21. An electro-optical device comprising the semiconductor device according to claim 20.

* * * * *